United States Patent
Kadobe et al.

(10) Patent No.: US 12,557,593 B2
(45) Date of Patent: Feb. 17, 2026

(54) SUBSTRATE PROCESSING APPARATUS

(71) Applicant: Tokyo Electron Limited, Tokyo (JP)

(72) Inventors: Masato Kadobe, Tokyo (JP); Hiromi Nitadori, Iwate (JP); Kaoru Sato, Iwate (JP); Kiyohiko Gokon, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 414 days.

(21) Appl. No.: 18/159,306

(22) Filed: Jan. 25, 2023

(65) Prior Publication Data

US 2023/0253230 A1 Aug. 10, 2023

(30) Foreign Application Priority Data

Feb. 9, 2022 (JP) .................................. 2022-018480
Nov. 25, 2022 (JP) .................................. 2022-188358

(51) Int. Cl.
*H01L 21/677* (2006.01)
*H01L 21/67* (2006.01)

(52) U.S. Cl.
CPC .. *H01L 21/67781* (2013.01); *H01L 21/67017* (2013.01); *H01L 21/6719* (2013.01); *H01L 21/67742* (2013.01)

(58) Field of Classification Search
CPC ......... H01L 21/67781; H01L 21/67017; H01L 21/6719; H01L 21/67742; H01L 21/67109; H01L 21/67757; H01L 21/67178; H01L 21/67769; H01L 21/67167; H01L 21/67173

See application file for complete search history.

(56) References Cited

U.S. PATENT DOCUMENTS

| 5,855,726 | A | 1/1999 | Soraoka et al. |
| 9,502,275 | B1* | 11/2016 | Trussell ............ H01L 21/67733 |
| 2008/0236488 | A1 | 10/2008 | Takeshita et al. |
| 2008/0257260 | A9 | 10/2008 | Brailove et al. |
| 2010/0158642 | A1* | 6/2010 | Duer ................. H01L 21/67167 414/217 |
| 2012/0180883 | A1* | 7/2012 | Odagiri ............ H01L 21/67173 137/561 R |

(Continued)

FOREIGN PATENT DOCUMENTS

JP 2020-113746 7/2020

*Primary Examiner* — Glenn F Myers
(74) *Attorney, Agent, or Firm* — IPUSA, PLLC

(57) ABSTRACT

A substrate processing apparatus includes a loading and unloading unit having a first side surface through which a container accommodating a substrate is loaded and unloaded, and a second side surface opposite to the first side surface, a substrate transport unit extending along a first horizontal direction perpendicular to the second side surface, and a plurality of batch processing units adjacent to one another along a longitudinal direction of the substrate transport unit. Each of the plurality of batch processing units includes a processing container configured to accommodate and process a plurality of substrates, a gas supply unit configured to supply a gas into the processing container, and an exhaust unit configured to exhaust the gas inside the processing container. A first maintenance area, used for attending to a maintenance of the plurality of batch processing units, is provided above the exhaust unit.

11 Claims, 21 Drawing Sheets

(56) References Cited

U.S. PATENT DOCUMENTS

| | | | |
|---|---|---|---|
| 2015/0086302 A1* | 3/2015 | Senzaki | H01J 37/32899 |
| | | | 414/800 |
| 2020/0227293 A1* | 7/2020 | Kadobe | F27D 9/00 |
| 2021/0057243 A1* | 2/2021 | Motegi | H01L 21/67173 |
| 2022/0230902 A1* | 7/2022 | Ito | H01L 21/67196 |
| 2022/0349061 A1 | 11/2022 | Okajima | |

* cited by examiner

SUBSTRATE PROCESSING APPARATUS

CROSS-REFERENCE TO RELATED APPLICATIONS

This application is based upon and claims priority to Japanese Patent Application No. 2022-018480, filed on Feb. 9, 2022, and Japanese Patent Application No. 2022-188358, filed on Nov. 25, 2022, the entire contents of which are incorporated herein by reference.

BACKGROUND

1. Field of the Invention

The present disclosure relates to substrate processing apparatuses.

2. Description of the Related Art

In a vertical heat treatment apparatus configured to process a plurality of substrates by a batch processing, there is known a configuration in which a plurality of process modules is provided with respect to one loader module (for example, refer to Japanese Laid-Open Patent Publication No. 2020-113746).

SUMMARY

The present disclosure provides a technique capable of reducing an installation area of a substrate processing apparatus including a plurality of batch processing units, and facilitating maintenance of the plurality of batch processing units.

According to one aspect of the present disclosure, a substrate processing apparatus includes a loading and unloading unit having a first side surface through which a container accommodating a substrate is loaded and unloaded, and a second side surface opposite to the first side surface; a substrate transport unit extending along a first horizontal direction perpendicular to the second side surface; and a plurality of batch processing units adjacent to one another along a longitudinal direction of the substrate transport unit, wherein each of the plurality of batch processing units includes a processing container configured to accommodate and process a plurality of substrates, a gas supply unit configured to supply a gas into the processing container, and an exhaust unit configured to exhaust the gas inside the processing container, and a first maintenance area, used for attending to a maintenance of the plurality of batch processing units, is provided above the exhaust unit.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DETAILED DESCRIPTION

Figure 1:
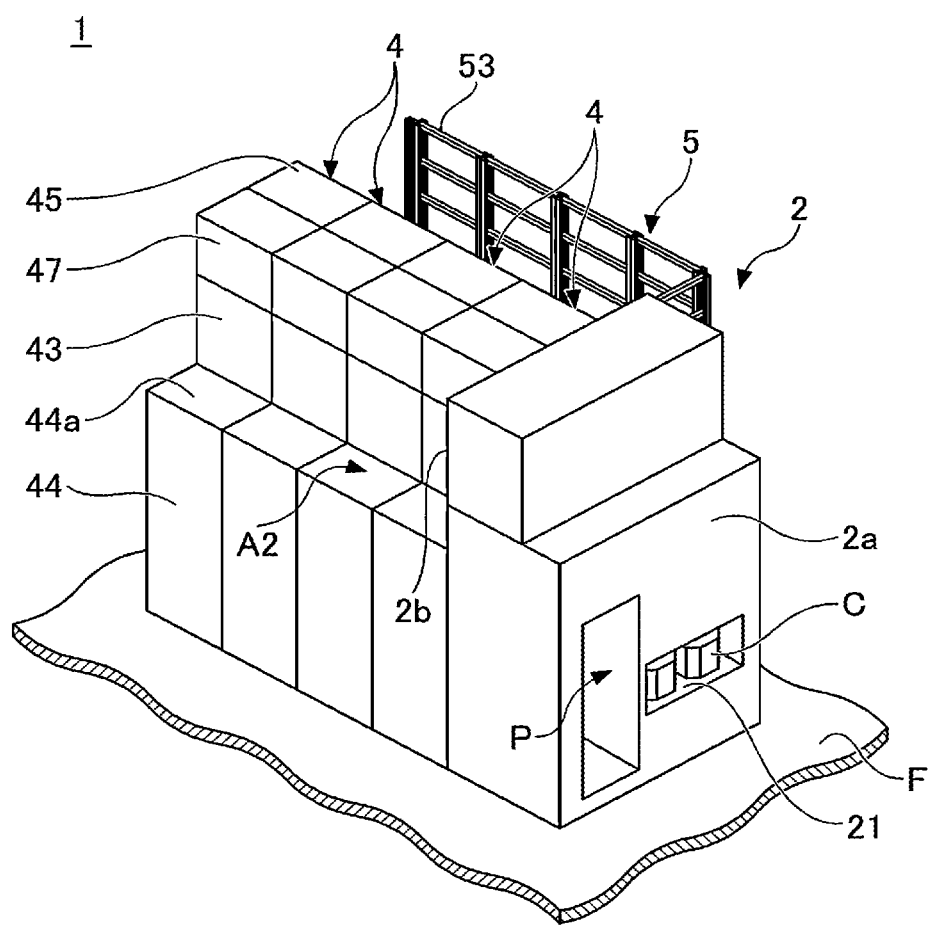
FIG. 1 is a perspective view (part 1) illustrating a substrate processing apparatus according to an embodiment.

Non-limiting exemplary embodiments of the present disclosure will now be described, with reference to the accompanying drawings. In each of the accompanying drawings, the same or corresponding members or components are denoted by the same or corresponding reference numerals, and a redundant description of the same or corresponding members or components will be omitted. In this specification, an X-axis direction, a Y-axis direction, and a Z-axis direction are directions perpendicular to one another. The X-axis direction and the Y-axis direction are horizontal directions, and the Z-axis direction is a vertical direction.

[Substrate Processing Apparatus]

Figure 2:
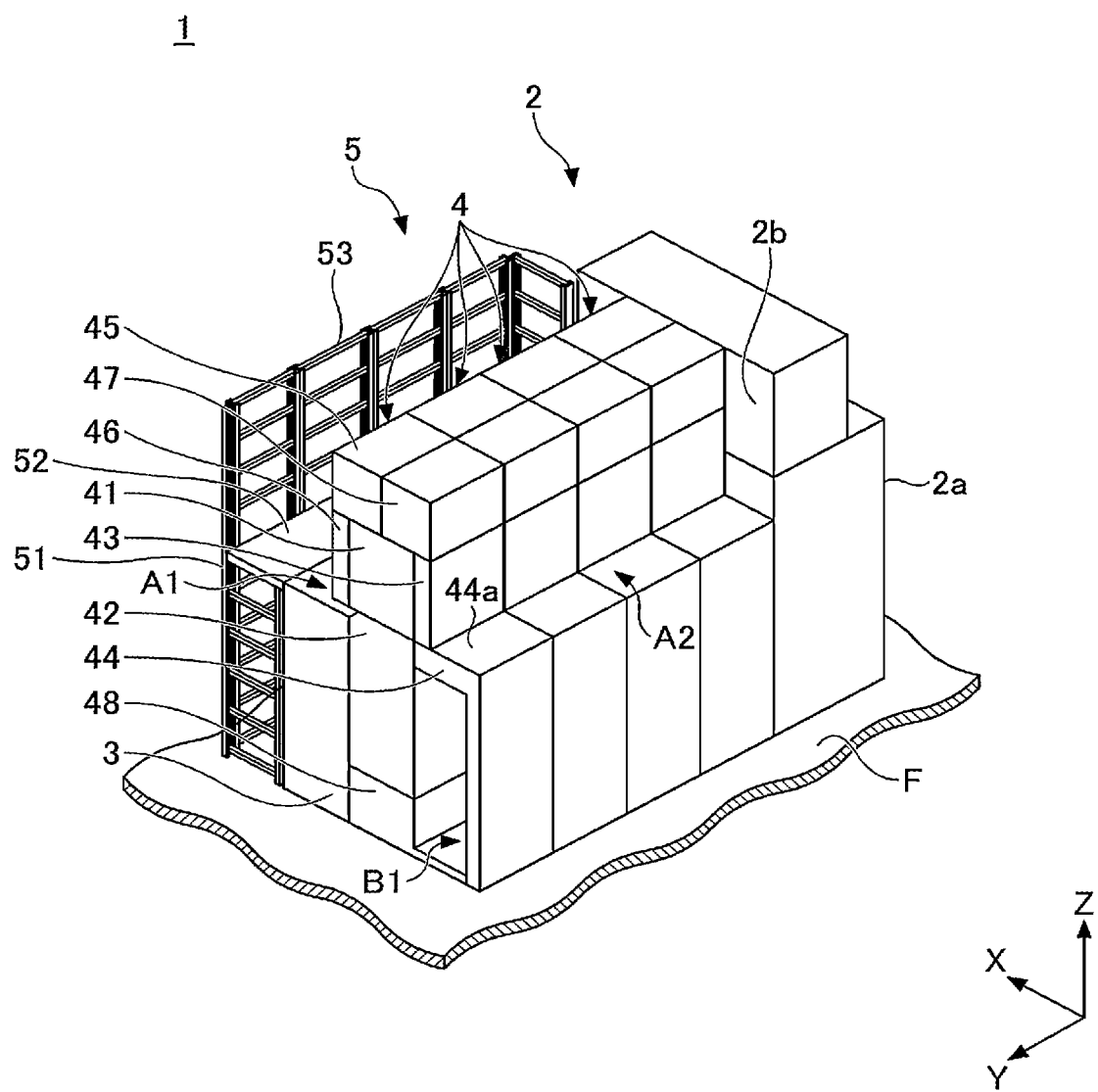
FIG. 2 is a perspective view (part 2) illustrating the substrate processing apparatus according to the embodiment.
Figure 3:
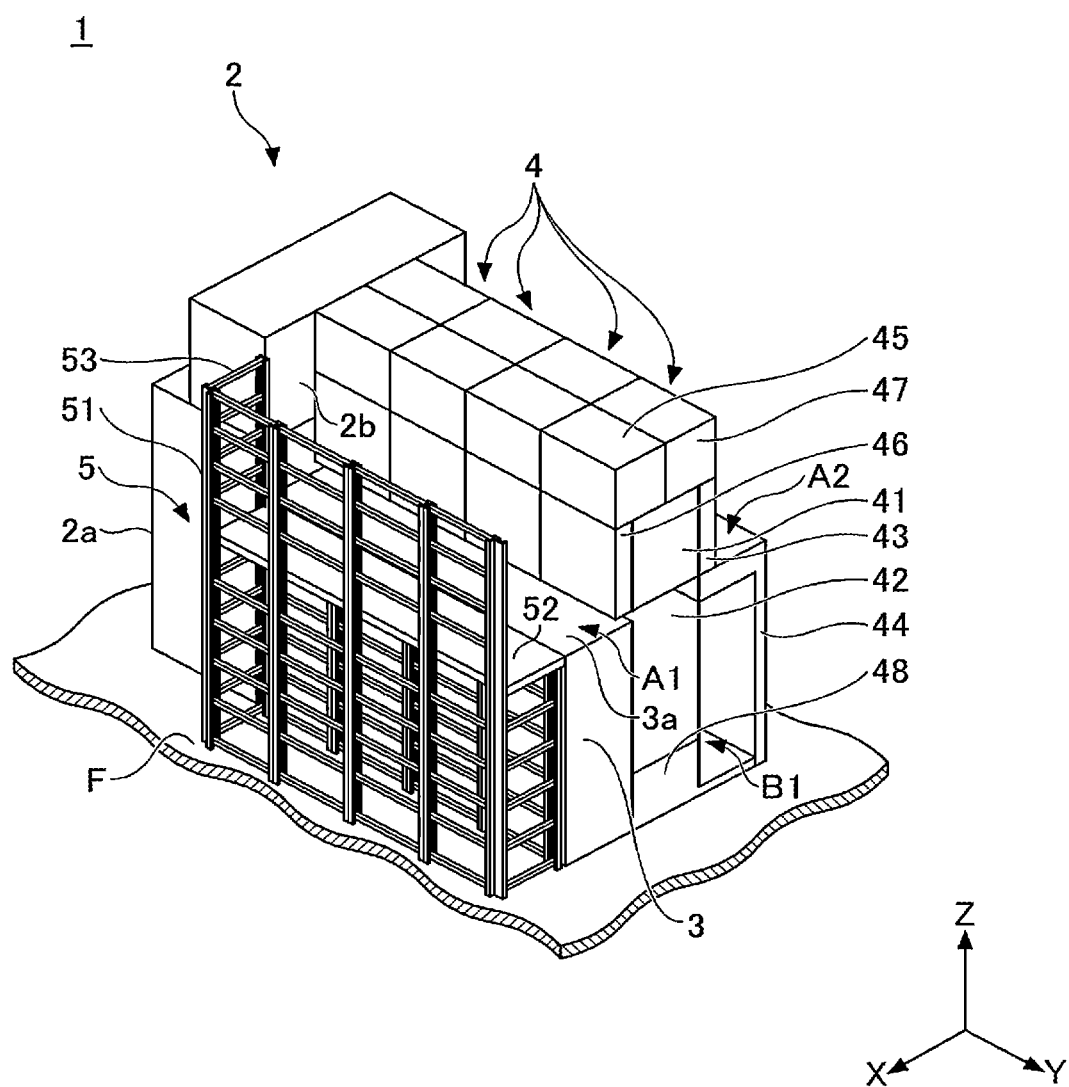
FIG. 3 is a perspective view (part 3) illustrating the substrate processing apparatus according to the embodiment.
Figure 4:
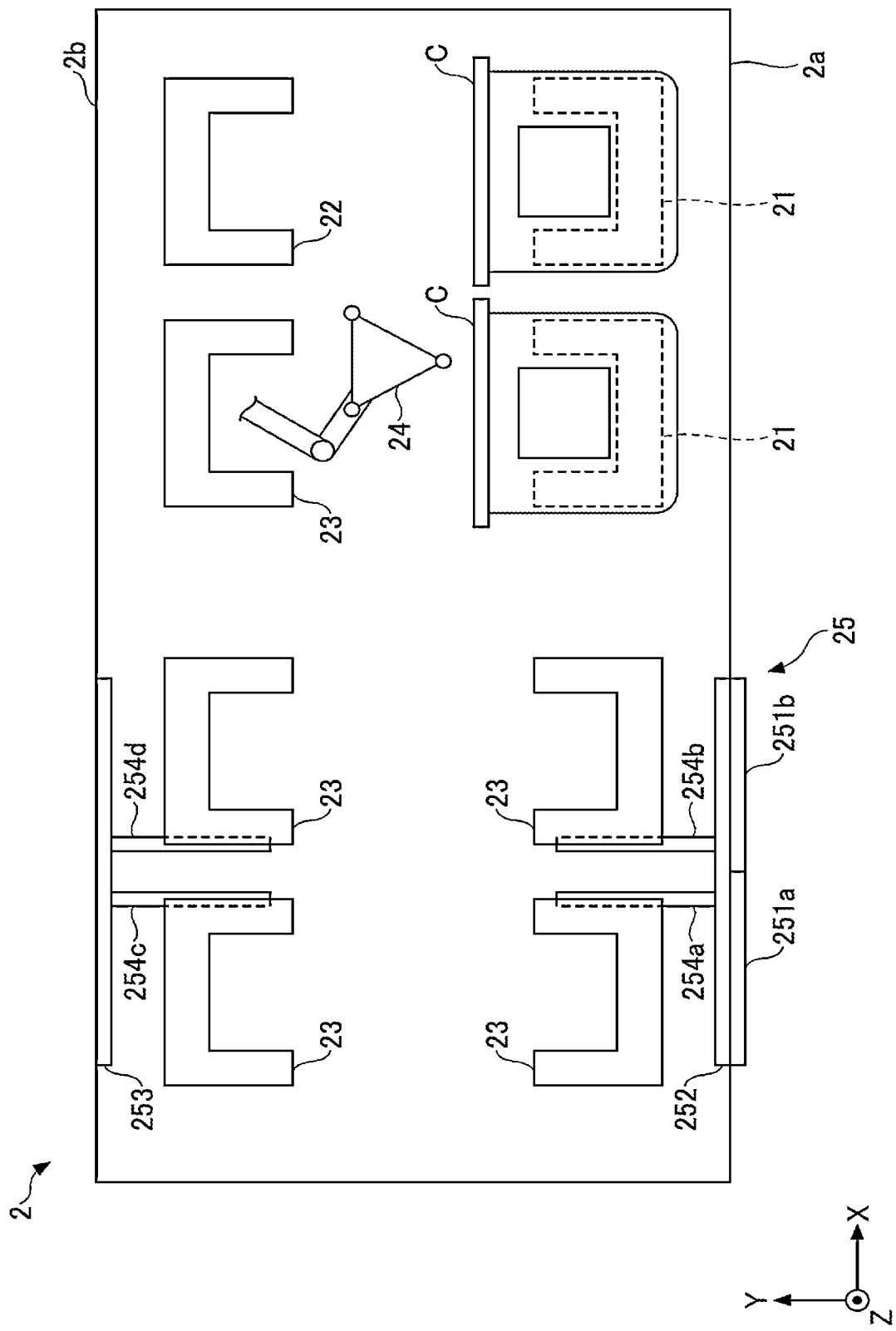
FIG. 4 is a schematic view (part 1) illustrating a loading and unloading unit.
Figure 5:
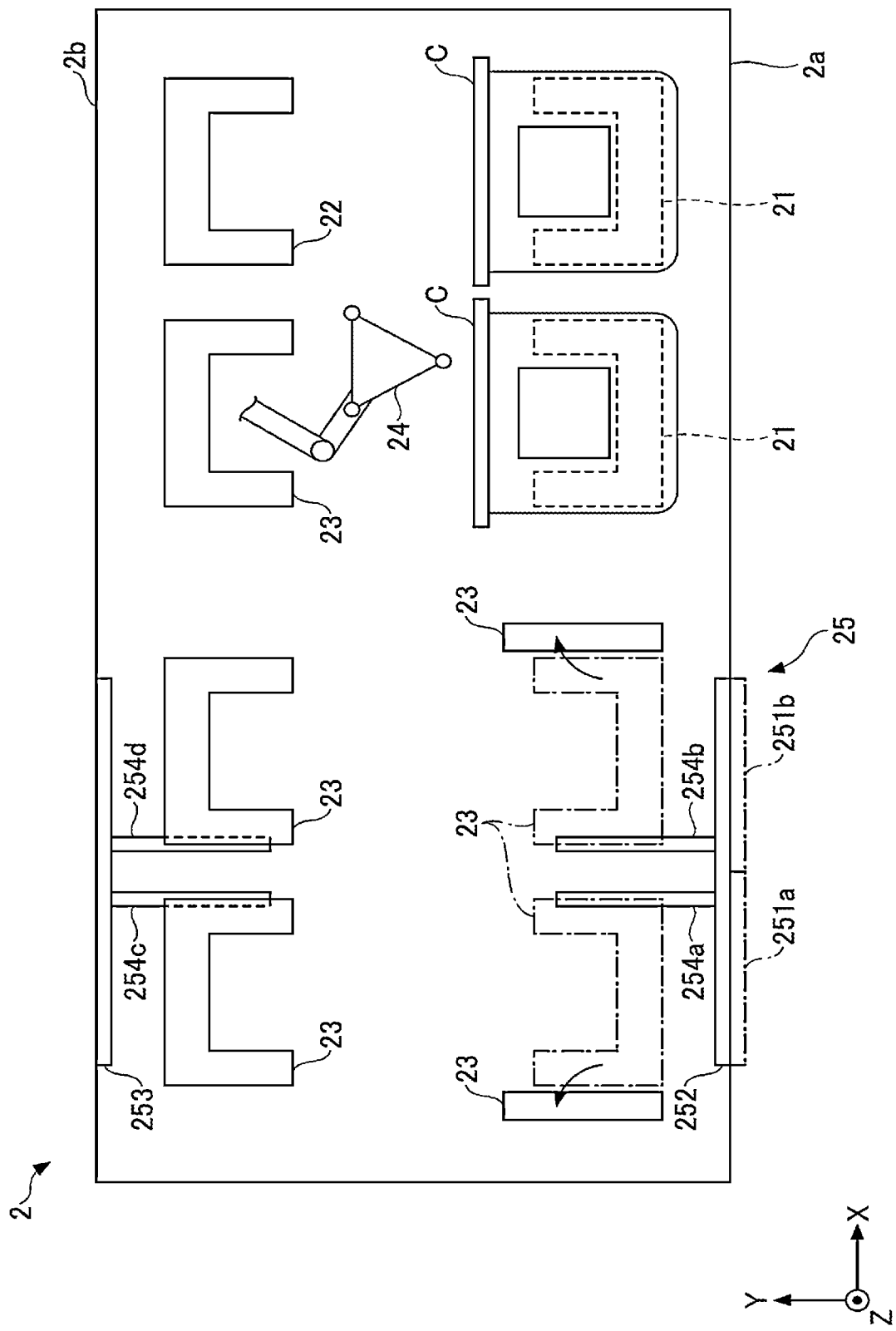
FIG. 5 is a schematic view (part 2) illustrating the loading and unloading unit.
Figure 6:
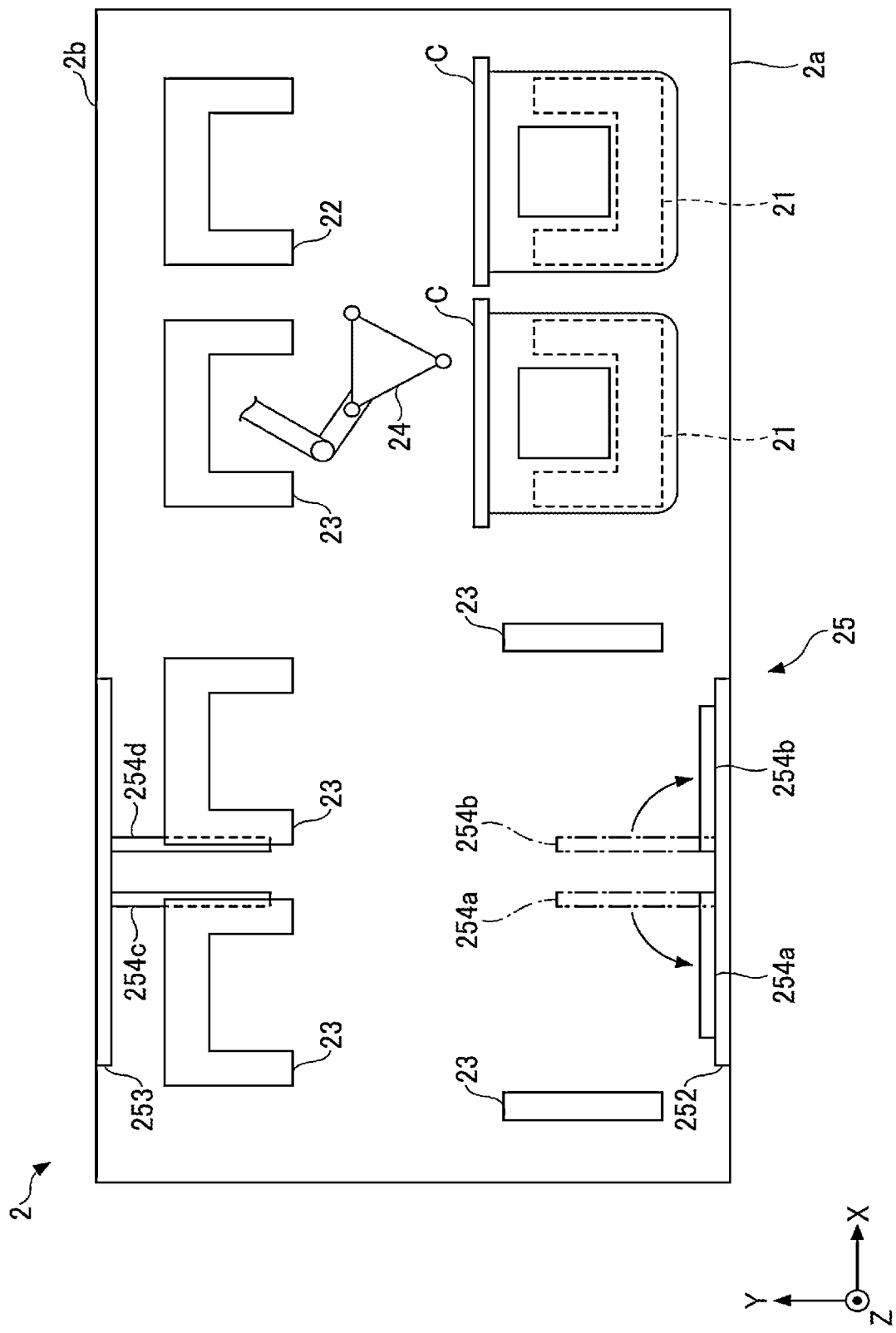
FIG. 6 is a schematic view (part 3) illustrating the loading and unloading unit.
Figure 7:
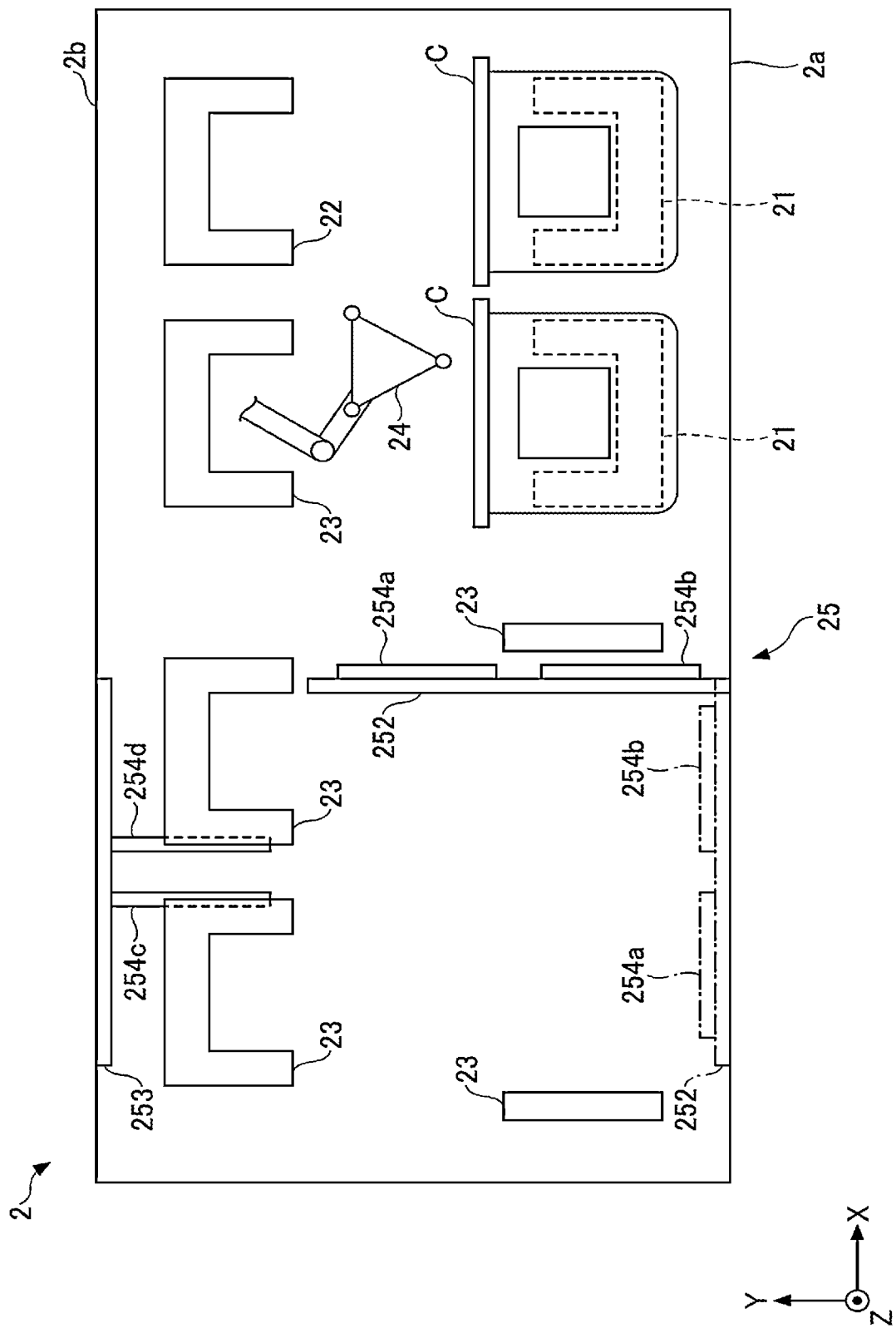
FIG. 7 is a schematic view (part 4) illustrating the loading and unloading unit.
Figure 8:
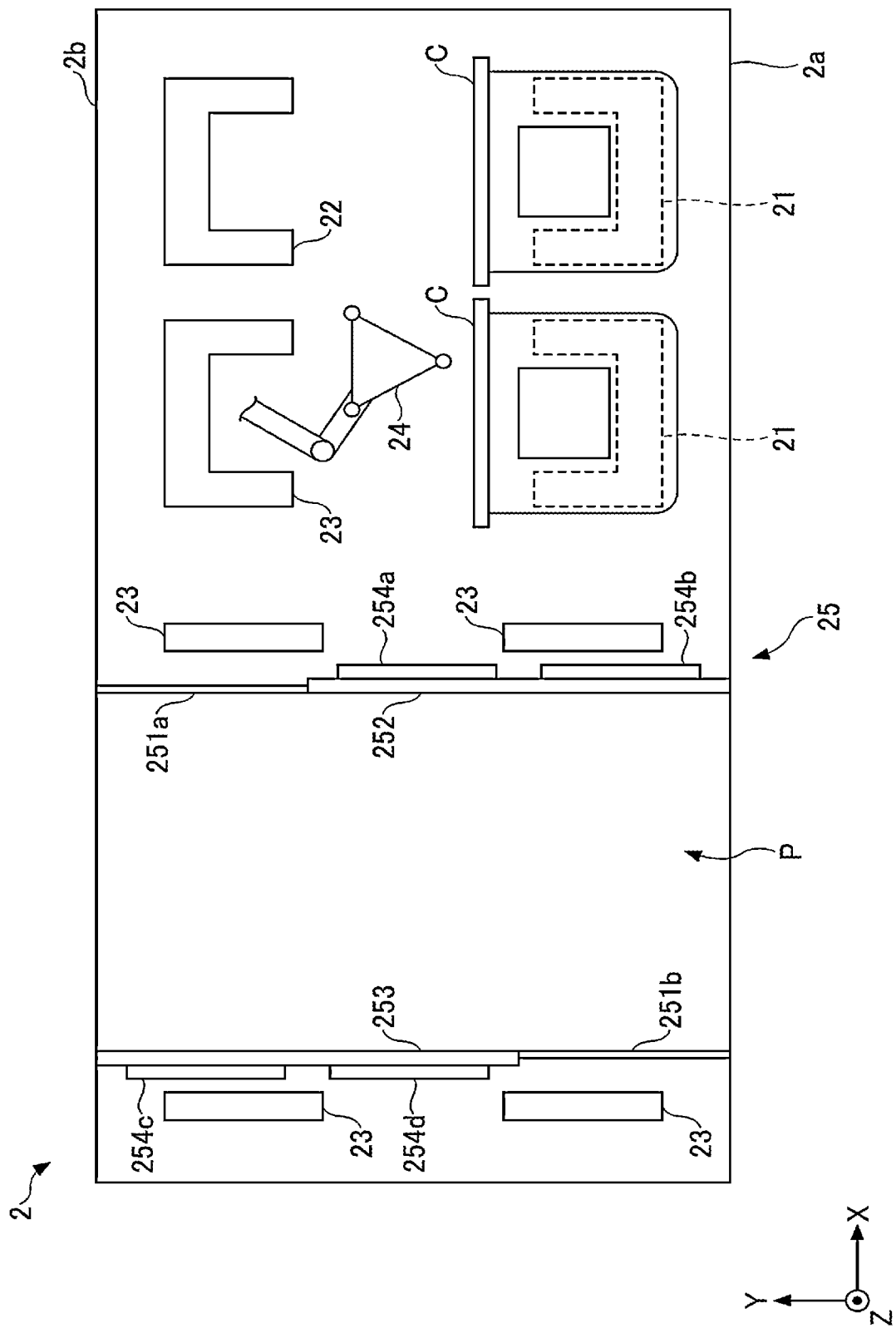
FIG. 8 is a schematic view (part 5) illustrating the loading and unloading unit.
Figure 9:
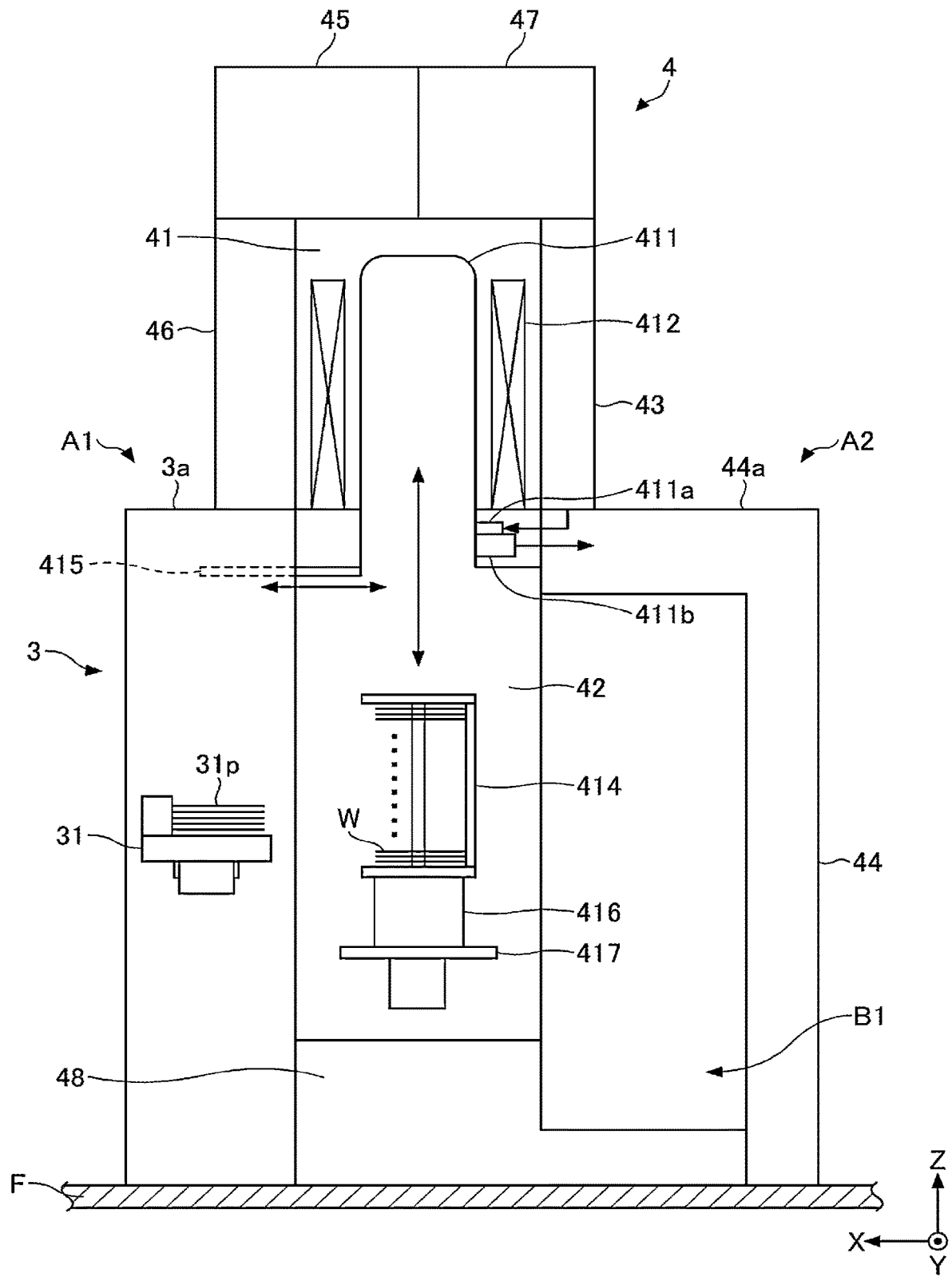
FIG. 9 is a schematic view illustrating a substrate transport unit and a batch processing unit.

A substrate processing apparatus 1 according to an embodiment will be described, with reference to FIG. 1 through FIG. 9. FIG. 1 through FIG. 3 are perspective views illustrating the substrate processing apparatus 1 according to the embodiment, and illustrate views of the substrate processing apparatus 1 viewed from different directions, respectively. FIG. 4 through FIG. 8 are schematic views illustrating the loading and unloading unit 2, and illustrate views of the inside of the loading and unloading unit 2 viewed from above. In FIG. 5 through FIG. 7, positions of components of the loading and unloading unit 2 before the components move are indicated by one-dot chain lines. FIG. 9 is a schematic view illustrating a substrate transport unit 3 and the batch processing unit 4, and illustrates a view of the insides of the substrate transport unit 3 and the batch processing unit 4 when viewed from a rear. In FIG. 9, an illustration of a scaffold 5 is omitted.

The substrate processing apparatus 1 includes the loading and unloading unit 2, the substrate transport unit 3, a plurality of batch processing units 4, and the scaffold 5.

The loading and unloading unit 2 includes a front surface 2a through which loading and unloading of a cassette C is performed, and a rear surface 2b opposite to the front surface 2a. The front surface 2a is located at a position of the loading and unloading unit 2 on a negative side along the Y-axis direction. The rear surface 2b is located at a position of the loading and unloading unit 2 on a positive side along the Y-axis direction. The cassette C is a container that accommodates a plurality of substrates W (25 substrates W in this example). The cassette C is a front-opening unified pod (FOUP), for example. The substrate W is a semiconductor wafer, for example. An inside of the loading and unloading unit 2 is under an air atmosphere, for example.

The loading and unloading unit 2 includes a load port 21, a loader 22, a storage shelf 23, a cassette transport unit 24, and a passage forming part 25.

The load port 21 is located at a position of the loading and unloading unit 2 on a positive side along the X-axis direction and the negative side along the Y-axis direction. In this example, two load ports 21 are provided along the X-axis direction. The cassette C is placed or set on the load port 21. The cassette C is loaded and unloaded with respect to the load port 21. The load ports 21 may be provided in multiple stages along the vertical direction (or Z-axis direction). The number of load ports 21 is not particularly limited.

The loader 22 is located at a position of the loading and unloading unit 2 on the positive side along the X-axis direction and the positive side along the Y-axis. One loader 22 is provided along the X-axis direction. The loader 22 is adjacent to the substrate transport unit 3. The cassette C is disposed on the loader 22. The loader 22 is provided with a lid opening and closing mechanism (not illustrated) for opening and closing a lid of the cassette C. The loaders 22 may be provided in multiple stages along the Z-axis direction. The number of loaders 22 is not particularly limited.

In this example, a plurality of storage shelves 23 are provided in the loading and unloading unit 2. The storage shelves 23 temporarily store the cassette C accommodating an unprocessed substrate W, an empty cassette C from which a substrate W is already removed, or the like. The storage shelf 23 is configured to be flipped up via a hinge, for example. The storage shelves 23 may be provided in multiple stages along the Z-axis direction. The storage shelves 23 may be provided above or below the loader 22. The number of storage shelves 23 is not particularly limited.

The cassette transport unit 24 transports the cassette C among the load port 21, the loader 22, and the storage shelf 23. The number of cassette transport units 24 is not particularly limited.

The passage forming part 25 forms a passage P penetrating the loading and unloading unit 2 and communicating the front surface 2a to the rear surface 2b. The passage P is connected to a lower maintenance area B1 that will be described later. By forming the passage P, an operator can enter and exit the lower maintenance area B1 from a side of the front surface 2a of the loading and unloading unit 2. The passage P is formed, as required, for enabling the maintenance of the batch processing unit 4 or the like.

The passage forming part 25 includes detachable doors 251a and 251b, a front door 252, a rear door 253, and brackets 254a through 254d.

The detachable doors 251a and 251b are detachably attached to the side of the front surface 2a of the loading and unloading unit 2. The detachable doors 251a and 251b are removed when forming the passage P, and are installed so as to form wall surfaces of the passage P.

The front door 252 is located at a position of the loading and unloading unit 2 on a negative side along the X-axis direction and on the negative side along the Y-axis direction. The front door 252 is rotatable around a rotation axis that is located at a position of the loading and unloading unit 2 on the positive side along the X-axis direction, and extends in the Z-axis direction. When forming the passage P, the front door 252 rotates clockwise to form the wall surface of the passage P. The front door 252 is provided with a small window (not illustrated) for flipping up the storage shelf 23.

The rear door 253 is located at a position of the loading and unloading unit 2 on the negative side along the X-axis direction and on the positive side along the Y-axis direction. The rear door 253 is rotatable around a rotation axis that is located at a position of the loading and unloading unit 2 on the negative side along the X-axis direction, and extends in the Z-axis direction. When forming the passage P, the rear door 253 rotates clockwise to form the wall surface of the passage P.

The brackets 254a and 254b are provided so as to extend from the front door 252 toward the positive side along the Y-axis direction. Each of the brackets 254a and 254b supports the storage shelf 23. The brackets 254a and 254b are attached to the front door 252. The brackets 254a and 254b are rotatable around rotation axes that are located at positions of the loading and unloading unit 2 on the negative side along the Y-axis direction, and extend in the Z-axis direction, respectively. When forming the passage P, the brackets 254a and 254b are rotated toward the front door 252 and are fixed.

The brackets 254c and 254d are provided so as to extend from the rear door 253 toward the negative side along the Y-axis direction. Each of the brackets 254c and 254d supports the storage shelf 23. The brackets 254c and 254d are attached to the rear door 253. The brackets 254c and 254d are rotatable around rotation axes that are located at positions of the loading and unloading unit 2 on the positive side along the Y-axis direction, and extend in the Z-axis direction. When forming the passage P, the brackets 254c and 254d are rotated toward the rear door 253 and are fixed.

When forming the passage P, the operator first removes the detachable doors 251a and 251b, as illustrated in FIG. 5. Next, the operator flips up the storage shelf 23 located on the side of the front surface 2a, through the small window of the front door 252. Next, as illustrated in FIG. 6, the operator rotates the brackets 254a and 254b toward the front door 252 through the small window of the front door 252, and fixes the brackets 254a and 254b to the front door 252. Next, as illustrated in FIG. 7, the operator rotates the front door 252 clockwise, so as to open the front door 252 to the inside of the loading and unloading unit 2. Next, the operator flips up the storage shelf 23 located on the side of the rear surface 2b, rotates the brackets 254c and 254d toward the side of the rear door 253 and fixes the brackets 254c and 254d to the rear door 253, and rotates the rear door 253 clockwise to open the rear door 253 to the inside of the loading and unloading unit 2. In addition, the operator attaches the removed detachable door 251a to the front door 252 at a position on the positive side along the Y-axis direction, and attaches the removed detachable door 251b to the rear door 253 at a position on the negative side along the Y-axis direction. Hence, the passage P having the front door 252, the rear door 253, and the detachable doors 252a and 252b as the wall surfaces thereof, is formed.

The substrate transport unit 3 is disposed on the loading and unloading unit 2 at a position on the positive side along the Y-axis direction. The substrate transport unit 3 extends along a first direction (or Y-axis direction) that is perpendicular to the rear surface 2b of the loading and unloading unit 2. The substrate transport unit 3 is installed on a floor F. One substrate transport unit 3 is provided in common with respect to the plurality of batch processing units 4. That is, the plurality of batch processing units 4 have the common substrate transport unit 3. The substrate transport unit 3 includes a substrate transport device 31. The substrate transport device 31 transports the substrate W between the loading and unloading unit 2 and each of the plurality of batch processing units 4. The substrate transport device 31 includes a plurality of picks 31p. In this case, the substrate transport device 31 can transport a plurality of substrates W simultaneously. For this reason, it is possible to reduce the time required to transport the substrates W. The number of picks 31p is not particularly limited. The substrate transport unit 3 has a flat upper surface 3a. The operator can ride or stand on the upper surface 3a. A first upper maintenance area A1 is formed above the substrate transport unit 3. The first upper maintenance area A1 is a maintenance area located at a high position of the substrate processing apparatus 1, and the operator can enter and exit the first upper maintenance area A1. In the first upper maintenance area A1, the operator can easily attend to the maintenance on the plurality of batch processing units 4 arranged in a front-rear direction.

The plurality of batch processing units 4 are disposed on the substrate transport unit 3 on the negative side along the X-axis direction. The plurality of batch processing units 4 are arranged adjacent to one another along a longitudinal direction (or Y-axis direction) of the substrate transport unit 3. In the illustrated example, four batch processing units 4 are arranged adjacent to one another along the longitudinal direction of the substrate transport unit 3. Each batch processing unit 4 processes a plurality of substrates W (for example, 25 to 150 substrates W) by a batch processing. An inside of each batch processing unit 4 has an inert gas atmosphere, such as a nitrogen gas atmosphere, for example. In this case, it is possible to reduce oxidation of the substrates W in the batch processing unit 4. Each batch processing unit 4 includes a heat treatment unit 41, a load unit 42, a gas supply unit 43, an exhaust unit 44, a process module control unit 45, a forced air cooling unit 46, a gas control unit 47, and a floor box 48.

The heat treatment unit 41 performs a predetermined heat treatment on a plurality of substrates W. The heat treatment unit 41 includes a processing container 411, and a heater 412.

The processing container 411 accommodates a substrate holder 414. The substrate holder 414 holds the substrates W in an approximately horizontal state at predetermined intervals along the vertical direction. The substrate holder 414 is made of a heat-resistant material, such as quartz, silicon carbide, or the like, for example. A gas inlet port 411a and an exhaust port 411b are provided in the processing container 411.

The gas inlet port 411a introduces a gas into the processing container 411. The gas inlet port 411a is provided in the processing container 411 at a position on the negative side along the X-axis direction. The position where the gas inlet port 411a is provided is preferably the same among the plurality of batch processing units 4. In this case, a pipe length between the gas supply unit 43 and the gas inlet port 411a can be made the same among the plurality of batch processing units 4, and a processing variation due to the different batch processing units 4 can be reduced.

The exhaust port 411b exhausts the gas inside the processing container 411. The exhaust port 411b is provided in the processing container 411 at a position on the negative side along the X-axis direction. That is, the exhaust port 411b is provided on the same side as the gas inlet port 411a. The position where the exhaust port 411b is provided is preferably the same among the plurality of batch processing units 4. In this case, exhaust conductances or exhaust rates can be made the same among the plurality of batch processing units 4, and a processing variation due to the different batch processing units 4 can be reduced.

The heater 412 has a cylindrical shape, for example, and is provided around the processing container 411. The heater 412 may have a shape different from the cylindrical shape. The heater 412 heats the substrates W accommodated inside the processing container 411. A shutter 415 is provided below the processing container 411. The shutter 415 is configured to move horizontally between a position where the shutter 415 closes an opening at a lower end of the processing container 411, and a position where the shutter 315 does not close the opening at the lower end of the processing container 411. The shutter 415 closes the opening at the lower end of the processing container 411 until the substrate holder 414 is unloaded from the processing container 411, and the next substrate holder 414 is loaded into the processing container 411.

The load unit 42 is provided below the heat treatment unit 41. The load unit 42 is installed on the floor F via the floor box 48. The floor box 48 may have an integrated configuration in which the floor box 48 is integrated into the load unit 42. The load unit 42 transports the substrates W accommodated inside the processing container 411 between the load unit 42 and the substrate transport unit 3. In the load unit 42, the substrate holder 414 is placed on the lid 417 via a heat insulating cylinder 416. The lid 417 is supported on an elevator mechanism (not illustrated). The elevator mechanism raises and lowers the lid 417, so as to load and unload the substrate holder 414 into or from the processing container 411. The elevator mechanism includes a ball screw, for example. The load unit 42 also functions as a space for cooling the substrates W processed in the heat treatment unit 41.

The gas supply unit 43 is disposed on the side of the heat treatment unit 41 opposite to the side on which the substrate transport unit 3 is disposed. The gas supply unit 43 supplies a processing gas to the gas inlet port 411a. The gas supply unit 43 is preferably disposed on the same side as the gas inlet port 411a. Accordingly, a pipe length between the gas supply unit 43 and the gas inlet port 411a can be reduced. For this reason, it is possible to obtain effects, such as reduced amount of pipe member and the pipe heater used, reduced power consumption of the pipe heater, reduced purge range when attending to the maintenance, reduced risk of impurities mixing into the processing container 411, or the like, for example. The gas supply unit 43 is disposed on the exhaust unit 44. The gas supply unit 43 is disposed at a height position that is approximately the same as a height position of the processing container 411. The gas supply unit 43 includes a flow rate controller, an on-off valve, or the like, for example.

The exhaust unit 44 is disposed on the same side as the gas supply unit 43. The exhaust unit 44 is preferably disposed on the same side as the exhaust port 411b. The exhaust unit 44 is disposed at a height position different from a height position of the gas supply unit 43, such as a position below the gas supply unit 43, for example. The exhaust unit 44 has an inverted L-shape in a plan view viewed in the first direction (or Y-axis direction). The lower maintenance area B1 is formed between the exhaust unit 44 and the load unit 42. The lower maintenance area B1 is a maintenance area located at a low position of the substrate processing apparatus 1, and the operator can enter and exit the lower maintenance area B1. In the lower maintenance area B1, the operator can easily attend to the maintenance of the plurality of batch processing units 4 arranged along the front-rear direction. The gas inlet port 411a and the exhaust port 411b are disposed on the same side of the processing container 411 (that is, on the side of the lower maintenance area B1). For this reason, in the lower maintenance area B1, the operator can simultaneously attend to the maintenance of the gas inlet port 411a and the exhaust port 411b. On the other hand, in a case where the gas inlet port 411a and the exhaust port 411b are disposed on opposite sides of the processing container 411, it is difficult for the operator, in the lower maintenance area B1, to simultaneously attend to the maintenance of the gas inlet port 411a and the exhaust port 411b.

One end of the exhaust unit 44 is connected to the exhaust port 411b, and the other end of the exhaust unit 44 extends downward and penetrates the floor F, so as to connect to an exhaust system (not illustrated) disposed below the floor F. The exhaust system exhausts and depressurizes the inside of the processing container 411, via the exhaust port 411b and the exhaust unit 44. The exhaust system includes a vacuum pump, a valve, or the like, for example. The exhaust unit 44 has a flat upper surface 44a. The operator can ride or stand on the upper surface 44a. A second upper maintenance area A2 is formed above the exhaust unit 44. The second upper maintenance area A2 is a maintenance area located at a high position of the substrate processing apparatus 1, and the operator can enter and exit the second upper maintenance area A2. In the second upper maintenance area A2, the operator can easily attend to the maintenance of the plurality of batch processing units 4 arranged along the front-rear direction.

The forced air cooling unit 46 is a unit that generates a coolant to be supplied to the heater 412, and includes a heat exchanger, a blower, a valve, a pipe, or the like, for example. The coolant is air, for example.

The forced air cooling unit 46 is provided on the heat treatment unit 41 at a position on the positive side along the X-axis direction. The coolant from the forced air cooling unit 46 is supplied to a space between the processing container 411 and the heater 412. Hence, the processing container 411 can be cooled in a short period of time.

The process module control unit 45 and the gas control unit 47 are disposed on a ceiling portion of the heat treatment unit 41. The process module control unit 45 and the gas control unit 47 control the operation of each part of the batch processing unit 4. Each of the process module control unit 45 and the gas control unit 47 includes various controllers or the like, for example.

The scaffold 5 is disposed on the substrate transport unit 3 at a position on the positive side along the X-axis direction. The scaffold 5 extends along the first direction (or Y-axis direction). The scaffold 5 is detachably attached to the substrate transport unit 3. The scaffold 5 is made of stainless steel, such as SUS304 or the like, aluminum, or the like, for example. The scaffold 5 includes a support member 51, a floor plate 52, and a fence 53. The support member 51 supports the floor plate 52. The floor plate 52 is supported on the support member 51, so that the upper surface of the floor plate 52 coincides with the upper surface 3a of the substrate transport unit 3. An area (or region) above the floor plate 52 forms the first upper maintenance area A1, together with an area (or region) above the substrate transport unit 3. The fence 53 is provided on the floor plate 52 at a position on the positive side along the X-axis direction. By providing the fence 53, the operator, in the first upper maintenance area A1, can attend to the maintenance of each part of the batch processing unit 4 with an improved safety. A width of the first upper maintenance area A1 (that is, a sum of a length of the substrate transport unit 3 in the X-axis direction, and a length of the floor plate 52 in the X-axis direction) may be a length that can be passed by the heater 412. In the case where the heater 412 has the cylindrical shape, for example, the width of the first upper maintenance area A1 may be greater than a diameter of the heater 412. In this case, an operation to replace the heater 412 can easily be performed. For example, the width of the first upper maintenance area A1 is 1000 mm, for example, and the diameter of the heater 412 is 800 mm, for example.

As described above, according to the substrate processing apparatus 1, because the plurality of batch processing units 4 are disposed with respect to one substrate transport unit 3, the installation area of the substrate processing apparatus 1 can be reduced compared to the case where one batch processing unit 4 is disposed with respect to one substrate transport unit 3. For this reason, it is possible to improve the productivity per unit area.

In addition, the substrate processing apparatus 1 includes the first upper maintenance area A1 formed above the substrate transport unit 3, the second upper maintenance area A2 formed above the exhaust unit 44, and the lower maintenance area B1 formed between the load unit 42 and the exhaust unit 44. Hence, the operator can easily attend to the maintenance of each part of the batch processing unit 4 from a plurality of directions.

Moreover, according to the substrate processing apparatus 1, the gas inlet port 411a and the exhaust port 411b are disposed on the same side of the processing container 411 (that is, the side of the lower maintenance area B1). For this reason, the operator, in the lower maintenance area B1, can simultaneously attend to the maintenance of the gas inlet port 411a and the exhaust port 411b.

[Modification of Substrate Processing Apparatus]

Figure 10:
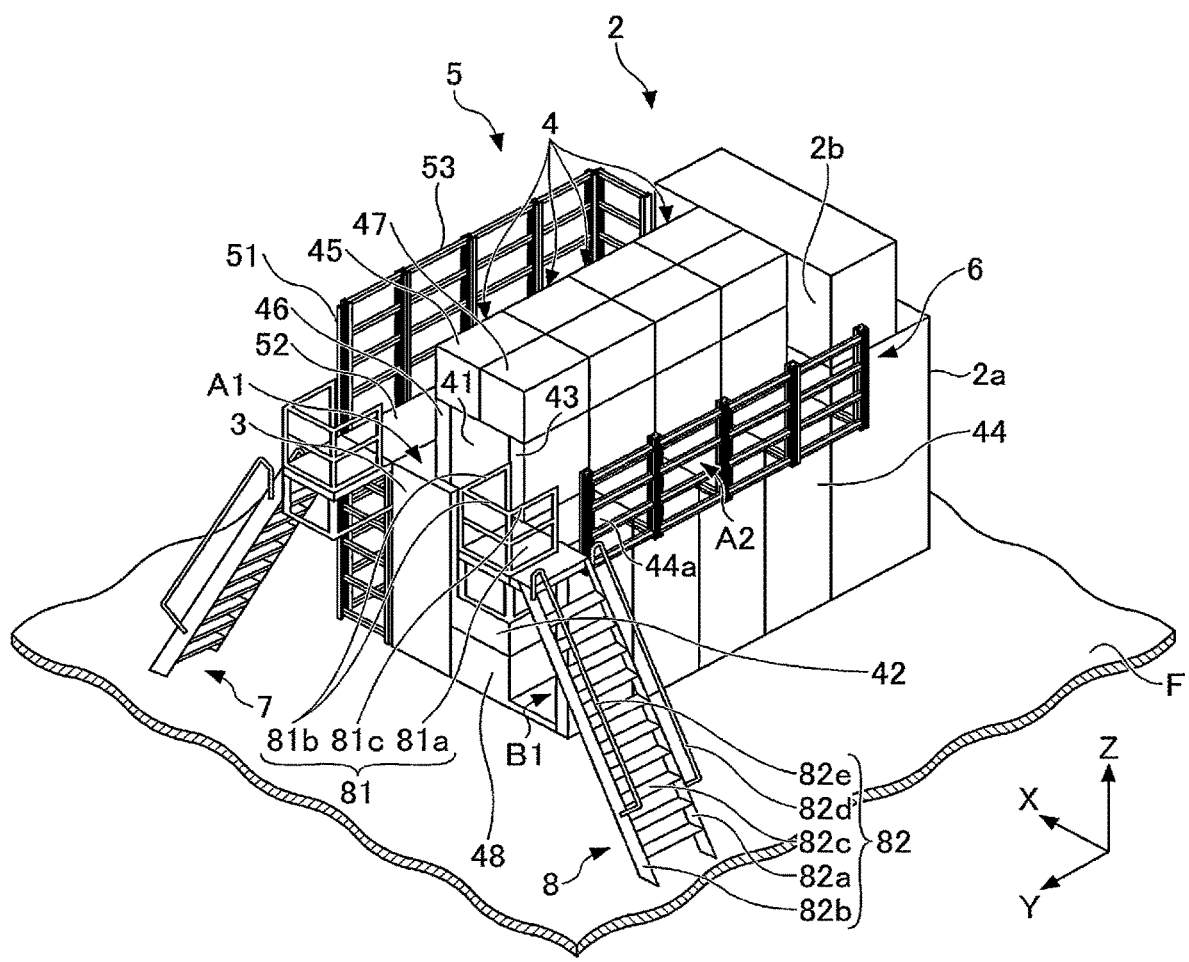
FIG. 10 is a perspective view (part 1) illustrating the substrate processing apparatus according to a modification of the embodiment.
Figure 11:
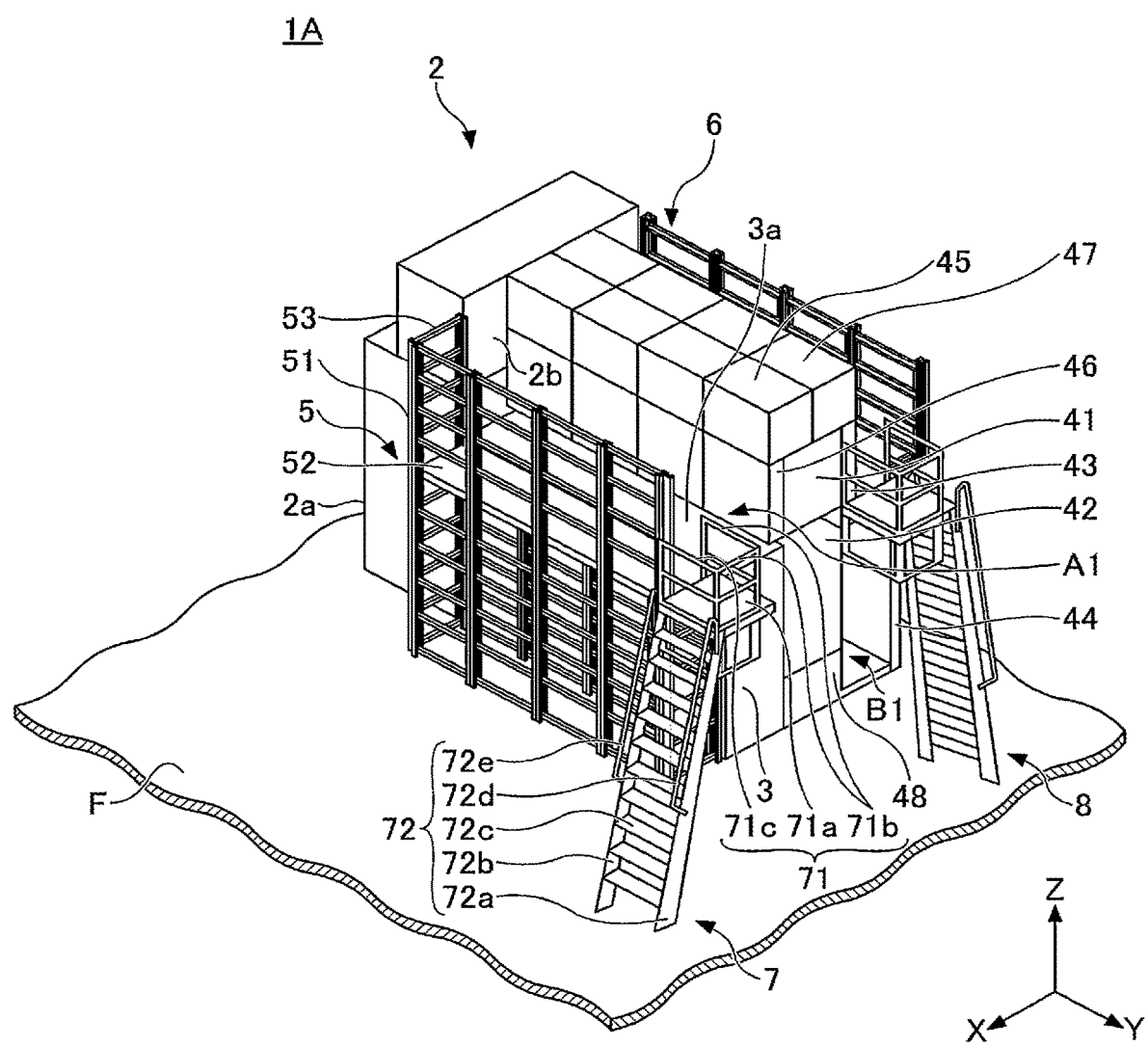
FIG. 11 is a perspective view (part 2) illustrating the substrate processing apparatus according to the modification of the embodiment.
Figure 12:
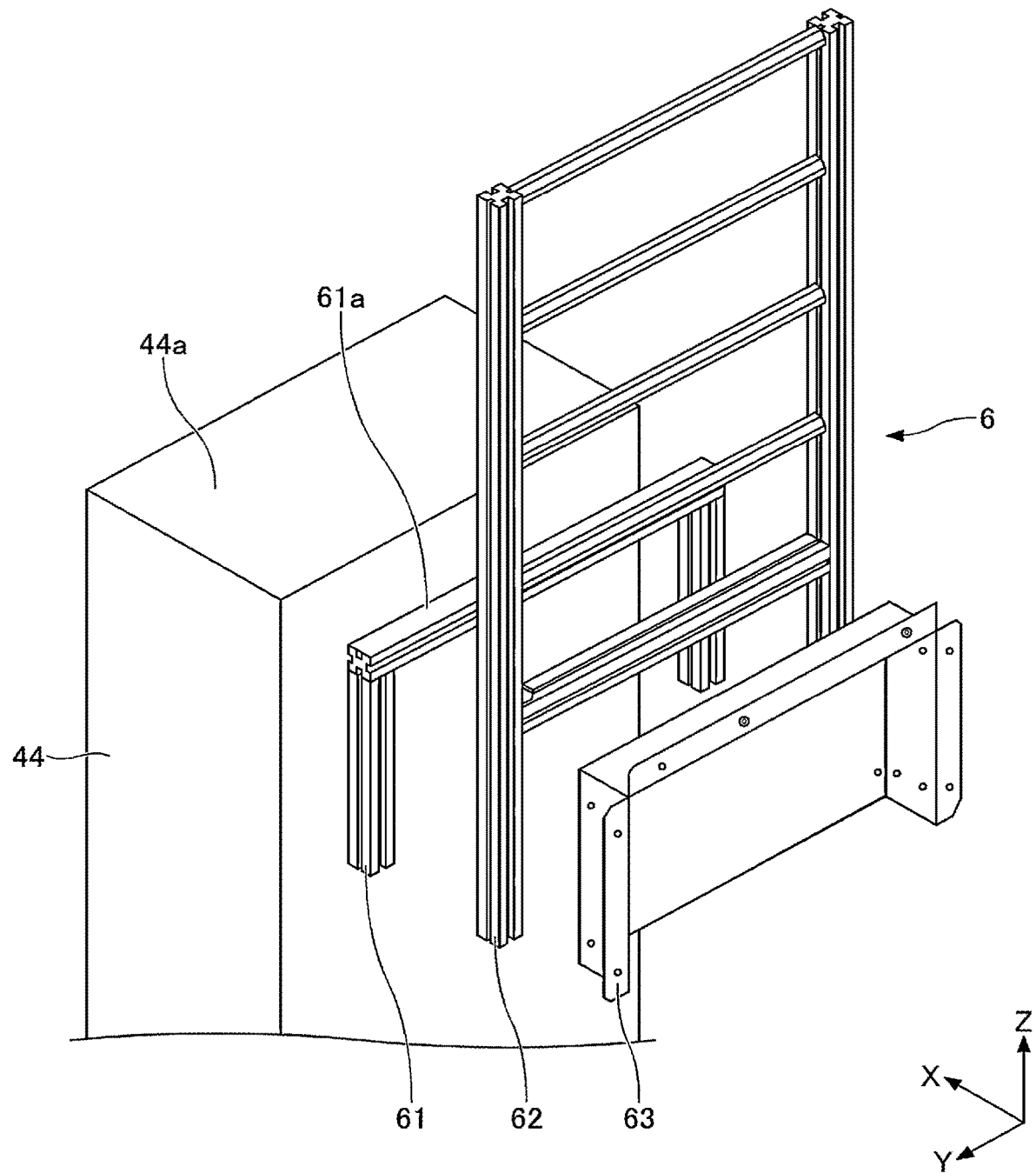
FIG. 12 is a disassembled perspective view of a fence attached to an exhaust unit.
Figure 13:
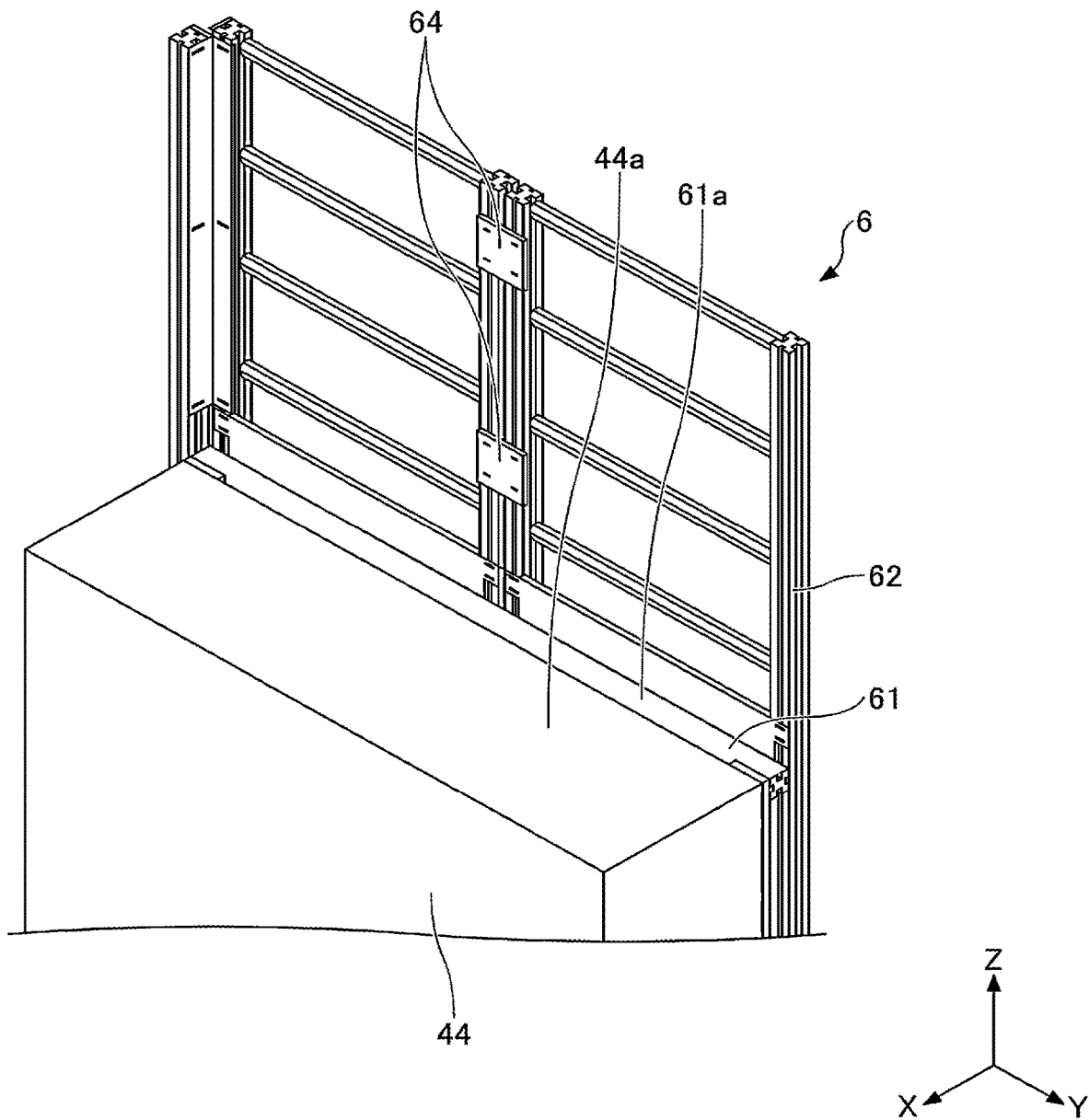
FIG. 13 is a perspective view illustrating the fence attached to the exhaust unit.

A substrate processing apparatus 1A according to a modification of the embodiment will be described, with reference to FIG. 10 through FIG. 13. FIG. 10 and FIG. 11 are perspective views illustrating the substrate processing apparatus 1A according to the modification of the embodiment, and illustrate views of the substrate processing apparatus 1A viewed from different directions, respectively. FIG. 12 is a disassembled perspective view of a fence 6 attached to the exhaust unit 44. FIG. 13 is a perspective view illustrating the fence 6 attached to the exhaust unit 44.

The substrate processing apparatus 1A includes the fence 6, and ladder jigs 7 and 8, in addition to the constituent elements of the substrate processing apparatus 1. Hereinafter, the substrate processing apparatus 1A will be described by mainly referring to differences from the substrate processing apparatus 1.

The fence 6 is provided for each batch processing unit 4. A length of each fence 6 along the Y-axis direction may be the same or approximately the same as the length of the corresponding batch processing unit 4 along the Y-axis direction. Each fence 6 is provided on the exhaust unit 44 of the corresponding batch processing unit 4 on the negative side along the X-axis direction. Each fence 6 is detachably attached to an upper portion of a side surface of the exhaust unit 44 of the corresponding batch processing unit 4 on the negative side along the X-axis direction. Each fence 6 includes a spacer 61, a fence body 62, a fixing member 63, and a connecting member 64.

The spacer 61 is sandwiched between the side surface of the exhaust unit 44 and the fence body 62. A height of an upper surface 61a of the spacer 61 may be the same or approximately the same as a height of the upper surface 44a of the exhaust unit 44. In this case, a length of the upper surface 44a of the exhaust unit 44 in the X-axis direction is increased by an amount corresponding to a length of the spacer 61 in the X-axis direction. The spacer 61 is made of stainless steel, such as SUS304 or the like, aluminum, or the like, for example. The spacer 61 may be omitted.

The fence body 62 is attached so that a lower end thereof is positioned below the upper surface 44a of the exhaust unit 44, and an upper end thereof is positioned above the upper surface 44a of the exhaust unit 44. The fence body 62 prevents the operator from falling from the second upper maintenance area A2. The fence body 62 is made of stainless steel, such as SUS304 or the like, aluminum, or the like, for example.

The fixing member 63 fixes the spacer 61 and the fence body 62 to an upper portion of the side surface of the exhaust unit 44 on the negative side along the X-axis direction.

The connecting member 64 connects the fence bodies 62 that are adjacent to each other in the Y-axis direction. The connecting member 64 includes a metal plate, and screws, for example. In this case, the length of the fence body 62 in the Y-axis direction can be varied according to the number of the batch processing units 4.

The ladder jig 7 is detachably attached to the scaffold 5. The ladder jig 7 is used when the operator enters and exits the first upper maintenance area A1. The ladder jig 7 has a landing (or pace) 71, and a ladder 72.

The landing 71 has a floor plate 71a, a fixed fence 71b, and a movable fence 71c.

The floor plate 71a is provided at an end portion of the floor plate 52 on the positive side along the Y-axis direction. The floor plate 71a is detachably attached to the support member 51 of the scaffold 5, for example. The floor plate 71a may be detachably attached to a side surface of the substrate transport unit 3 on the positive side along the Y-axis direction. The floor plate 71a is fixed by a metal plate, and screws, for example. A height of an upper surface of the floor plate 71a may be the same or approximately the same as the height of the upper surface of the floor plate 52.

The fixed fence 71b is provided on the floor plate 71a at a position on the negative side along the X-axis direction and on the positive side along the Y-axis direction. The fixed fence 71b prevents the operator from falling from the floor plate 71a.

The movable fence 71c is provided on the floor plate 71a at a position on the positive side along the X-axis direction. The movable fence 71c prevents the operator from falling from the floor plate 71a. The movable fence 71c can be opened and closed. The movable fence 71c is opened when the operator enters or exits the floor plate 71a. The movable fence 71c may inwardly open, for example. The movable fence 71c may be configured to close automatically, for example.

The ladder 72 includes a pair of supports (or posts) 72a and 72b, a plurality of rungs 72c, and a pair of handrails 72d and 72e.

The pair of supports 72a and 72b are arranged parallel to each other. Upper ends of the pair of supports 72a and 72b are detachably attached to the floor plate 71a of the landing 71.

The plurality of rungs 72c bridge the pair of supports 72a and 72b by extending between the pair of supports 72a and 72b. The plurality of rungs 72c are provided at predetermined intervals along the direction in which each of the supports 72a and 72b extends.

The handrail 72d is fixed to the support 72a. The handrail 72e is fixed to the support 72b. The handrails 72d and 72e are provided on both sides of the plurality of rungs 72c, respectively.

The ladder jig 8 is detachably attached to the exhaust unit 44. The ladder jig 8 is used when the operator enters and exits the second upper maintenance area A2. The ladder jig 8 has a landing 81, and a ladder 82.

The landing 81 has a floor plate 81a, a fixed fence 81b, and a movable fence 81c.

The floor plate 81a is provided at an end portion of the exhaust unit 44 on the positive side along the Y-axis direction. The floor plate 81a is detachably attached to the exhaust unit 44, for example. The floor plate 81a is fixed by a metal plate and screws, for example. A height of an upper surface of the floor plate 81a may be the same or approximately the same as the height of the upper surface 44a of the exhaust unit 44.

The fixed fence 81b is provided on the floor plate 81a at a position on the positive side along the X-axis direction and on the positive side along the Y-axis direction. The fixed fence 81b prevents the operator from falling from the floor plate 81a.

The movable fence 81c is provided on the floor plate 81a on the negative side along the X-axis direction. The movable fence 81c prevents the operator from falling from the floor plate 81a. The movable fence 81c can be opened and closed. The movable fence 81c is opened when the operator enters and exits the floor plate 81a. The movable fence 81c may be inwardly open, for example. The movable fence 81c may be configured to close automatically, for example.

The ladder 82 includes a pair of supports 82a and 82b, a plurality of rungs 82c, and a pair of handrails 82d and 82e.

The pair of supports 82a and 82b are arranged parallel to each other. Upper ends of the pair of supports 82a and 82b are detachably attached to the floor plate 81a of the landing 81.

The plurality of rungs 82c bridge the pair of supports 82a and 82b by extending between the pair of supports 82a and 82b. The plurality of rungs 82c are provided at predetermined intervals along the direction in which each of the supports 82a and 82b extends.

The handrail 82d is fixed to the support 82a. The handrail 82e is fixed to the support 82b. The handrails 82d and 82e are provided on both sides of the plurality of rungs 82c, respectively.

[Heater Replacement Method]

A method of replacing the heater 412 in the substrate processing apparatus 1 will be described, with reference to FIG. 14 through FIG. 17. FIG. 14 through FIG. 17 are perspective views illustrating an example of a heater replacement method. Hereinafter, a method of attaching the heater 412 to a batch processing unit 4A located closest to the loading and unloading unit 2 will be described.

Figure 14:
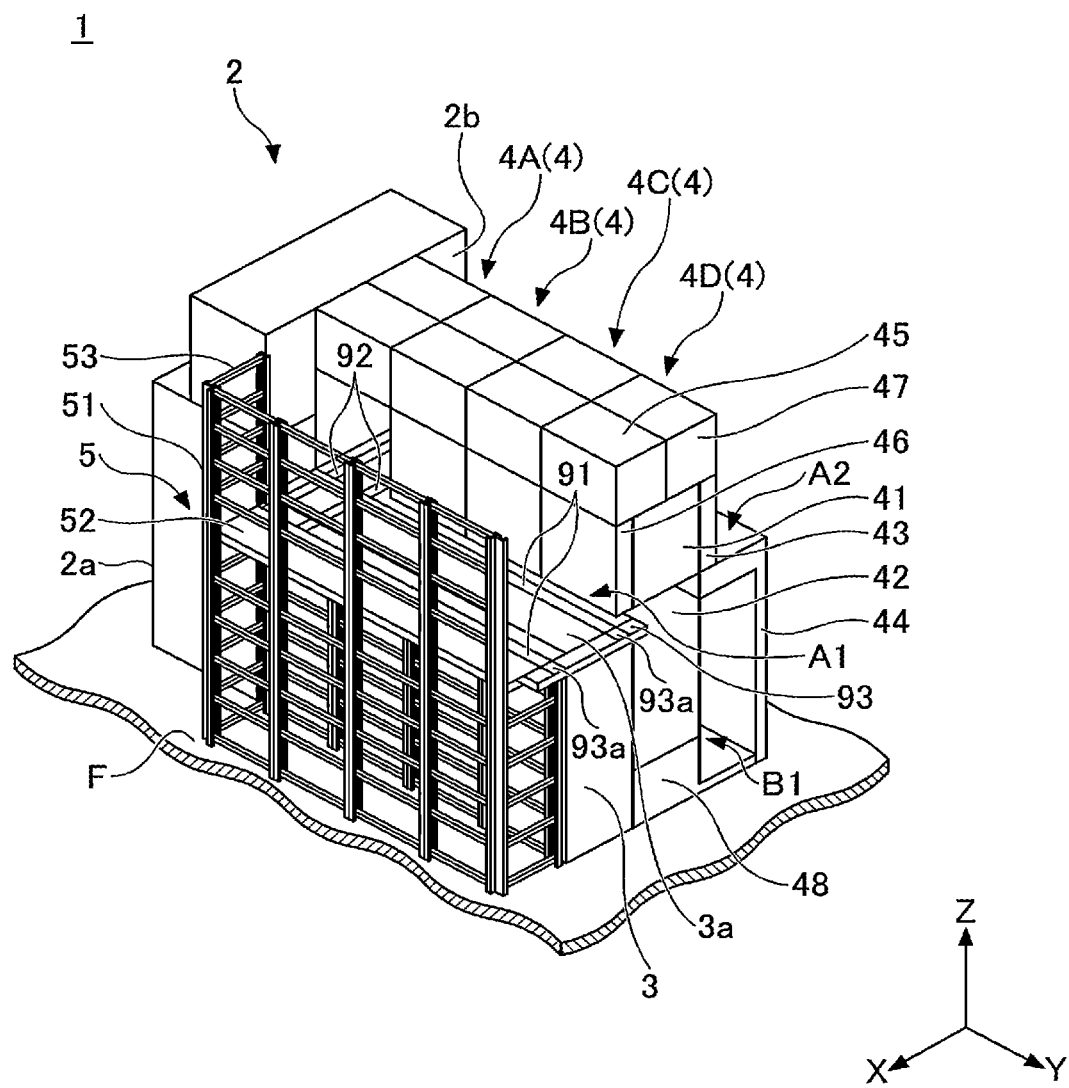
FIG. 14 is a perspective view (part 1) illustrating an example of a heater replacement method.

First, as illustrated in FIG. 14, an operator OP removes the forced air cooling unit 46 of the batch processing unit 4A, and attaches a first rail 91, a second rail 92, and a connecting member 93.

The first rail 91 is installed on the upper surface 3a of the substrate transport unit 3 and the upper surface of the floor plate 52, along the Y-axis direction. The first rail 91 is installed so as to extend from an end portion on the positive side along the Y-axis direction to an end portion on the negative side along the Y-axis direction of the substrate transport unit 3 and the floor plate 52. The first rail 91 may be dividable into a plurality of sections along a lengthwise direction. In this case, the length of the first rail 91 can be adjusted according to the number of batch processing units 4. In the case where the first rail 91 is divided into a plurality of sections, the length of each section of the first rail 91 may be the same or approximately the same as the length of one batch processing unit 4 along the Y-axis direction. The first rail 91 may include a rotating part (not illustrated) that moves the heater 412 by causing the heater 412 to slide on the first rail 91. The rotating part may be a roller, a ball roller, or the like, for example. A plurality of rotating parts may be provided at intervals along a longitudinal direction of the first rail 91.

The second rail 92 is installed from the upper surface of the floor plate 52 to the inside of the batch processing unit 4A via the upper surface 3a of the substrate transport unit 3, along the X-axis direction. The second rail 92 may include a rotating part (not illustrated) that moves the heater 412 by causing the heater 412 to slide on the second rail 92. The rotating portion may be a roller, a ball roller, or the like, for example. A plurality of rotating parts may be provided at intervals along a longitudinal direction of the second rail 92.

The connecting member 93 is attached to the end portions of the substrate transport unit 3 and the floor plate 52 on the positive side along the Y-axis direction. A height of an upper surface of the connecting member 93 may be the same or approximately the same as the height of the upper surface 3a of the substrate transport unit 3 and the height of the upper surface of the floor plate 52. A rail 93a, connected to the first rail 91, is provided on the upper surface of the connecting member 93. A base jig 94 that will be described later is connected to the connecting member 93.

Next, the operator OP moves a transport carriage (not illustrated) on which the heater 412 is placed, to a rear surface of the substrate processing apparatus 1. Next, operator OP transfers the heater 412 from the transport carriage onto the base jig 94. Next, the operator OP operates a stopper (not illustrated), so as to fix the heater 412 on the base jig 94.

Figure 15:
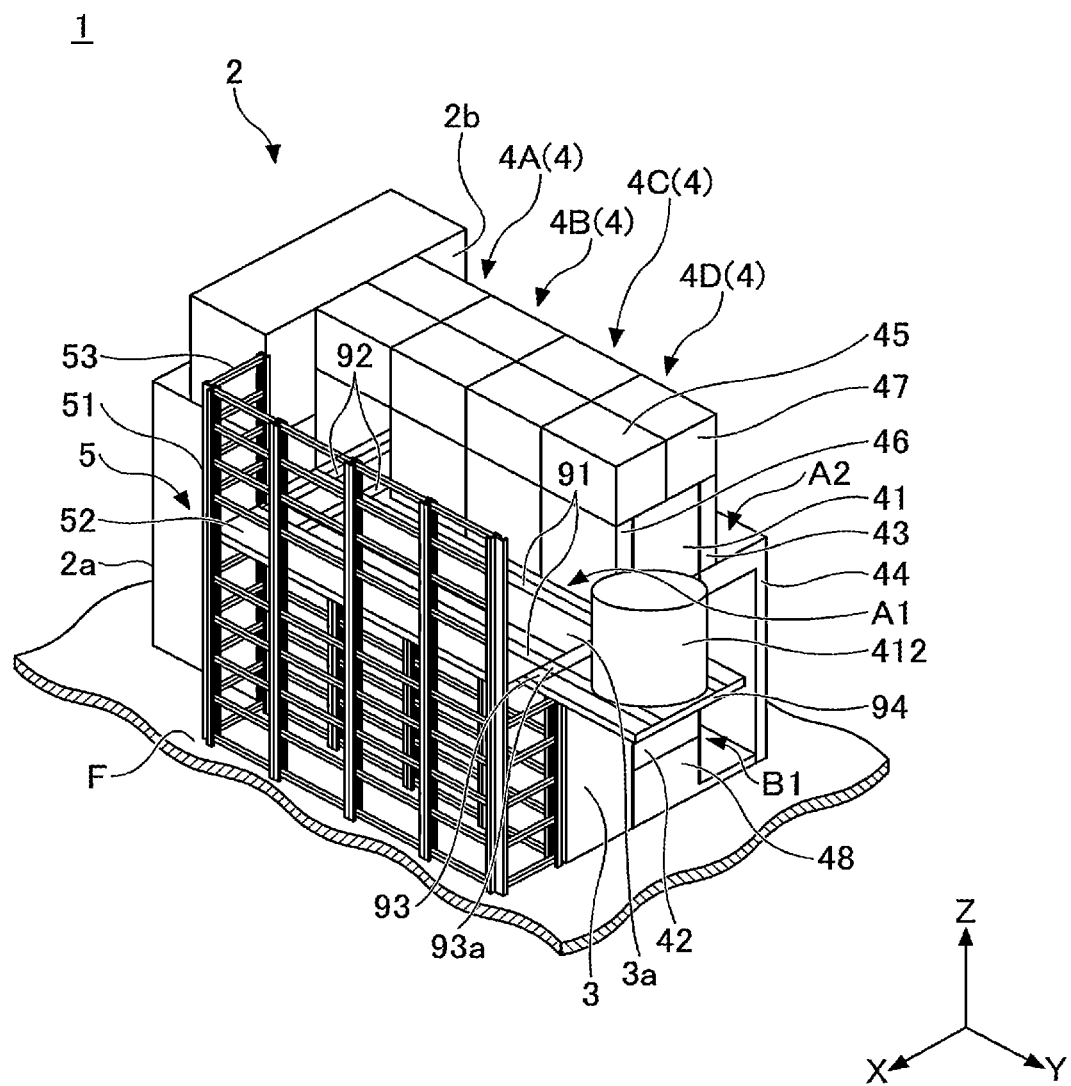
FIG. 15 is a perspective view (part 2) illustrating the example of the heater replacement method.

Next, as illustrated in FIG. 15, the operator OP lifts the base jig 94 on which the heater 412 is placed, to the height of the connecting member 93, using a lifter (not illustrated). Next, the operator OP connects the base jig 94 to the connecting member 93.

Figure 16:
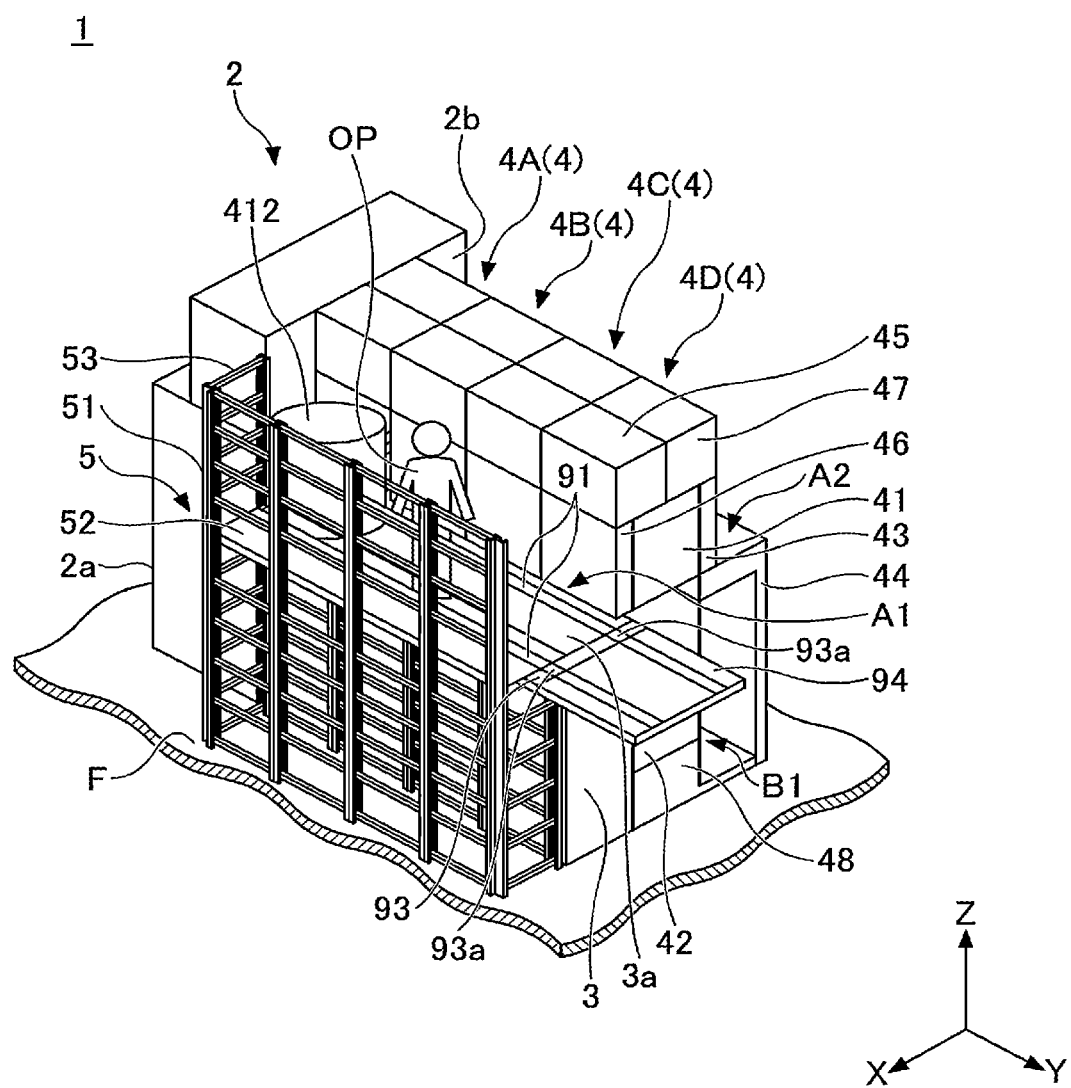
FIG. 16 is a perspective view (part 3) illustrating the example of the heater replacement method.

Next, as illustrated in FIG. 16, the operator OP releases the stopper, and moves the heater 412 placed on the base jig 94 by causing the heater 412 to slide along the first rail 91 to the side of the batch processing unit 4A. After the heater 412 slides and moves to the side of the batch processing unit 4A, the heater 412 may be horizontally rotated. In a case where an angle of the heater 412 when the heater 412 slides and moves along the first rail 91, is different from an angle of the heater 412 when the heater 412 slides and moves along the second rail 92, for example, the heater 412 may be horizontally rotated.

Figure 17:
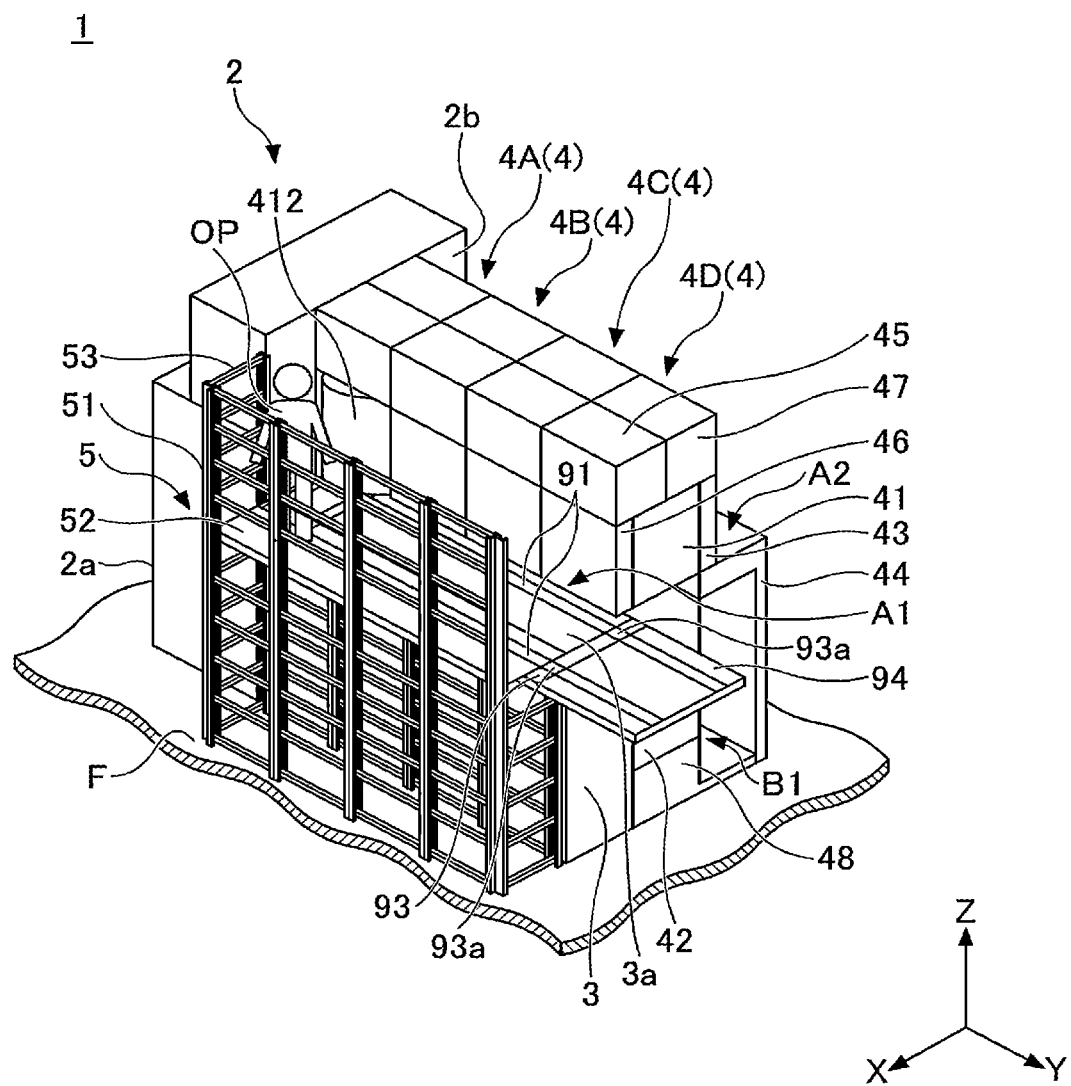
FIG. 17 is a perspective view (part 4) illustrating the example of the heater replacement method.

Next, as illustrated in FIG. 17, the operator OP moves the heater 412, moved to the batch processing unit 4A, by causing the heater 412 to slide along the second rail 92 to the inside of the batch processing unit 4A. After the heater 412 slides and moves to the inside of the batch processing unit 4A, the heater 412 may be horizontally rotated. In a case where the angle of the heater 412 when the heater 412 slides and moves along the second rail 92, is different from an angle of the heater 412 when the heater 412 is fixed inside the batch processing unit 4A, for example, the heater 412 may be horizontally rotated. Next, the operator OP fixes the heater 412 inside the batch processing unit 4A. The heater 412 is fixed using fastening members, such as screws or the like, for example.

As described above, the heater 412 is attached to the batch processing unit 4A. The heater 412 can be removed from the batch processing unit 4A by a procedure carried out in reverse to the method of attaching the heater 412 to the batch processing unit 4A. In addition, the heaters 412 of the other batch processing units 4B, 4C, and 4D can be replaced by a similar method. Further, in the substrate processing apparatus 1A, the heater 412 can be replaced by the same method used to replace the heater 412 in the substrate processing apparatus 1.

In the embodiments described above, the front surface 2a is an example of a first side surface, and the rear surface 2b is an example of a second side surface.

The embodiments disclosed herein are illustrative in all respects and are non-limiting. In the embodiments described above, various variations, modifications, omissions, and substitutions may be made without departing from the scope and spirit of the present disclosure including the appended claims.

Although the case where the passage P is formed in the loading and unloading unit 2, as required, is described in the embodiments, the present disclosure is not limited to such a case. For example, a permanent passage may be formed in the loading and unloading unit 2.

Although the case where one substrate processing apparatus 1 is installed on the floor F is described in the embodiments, the present disclosure is not limited to such a case. For example, a plurality of substrate processing apparatuses 1 may be installed on the floor F.

Figure 18:
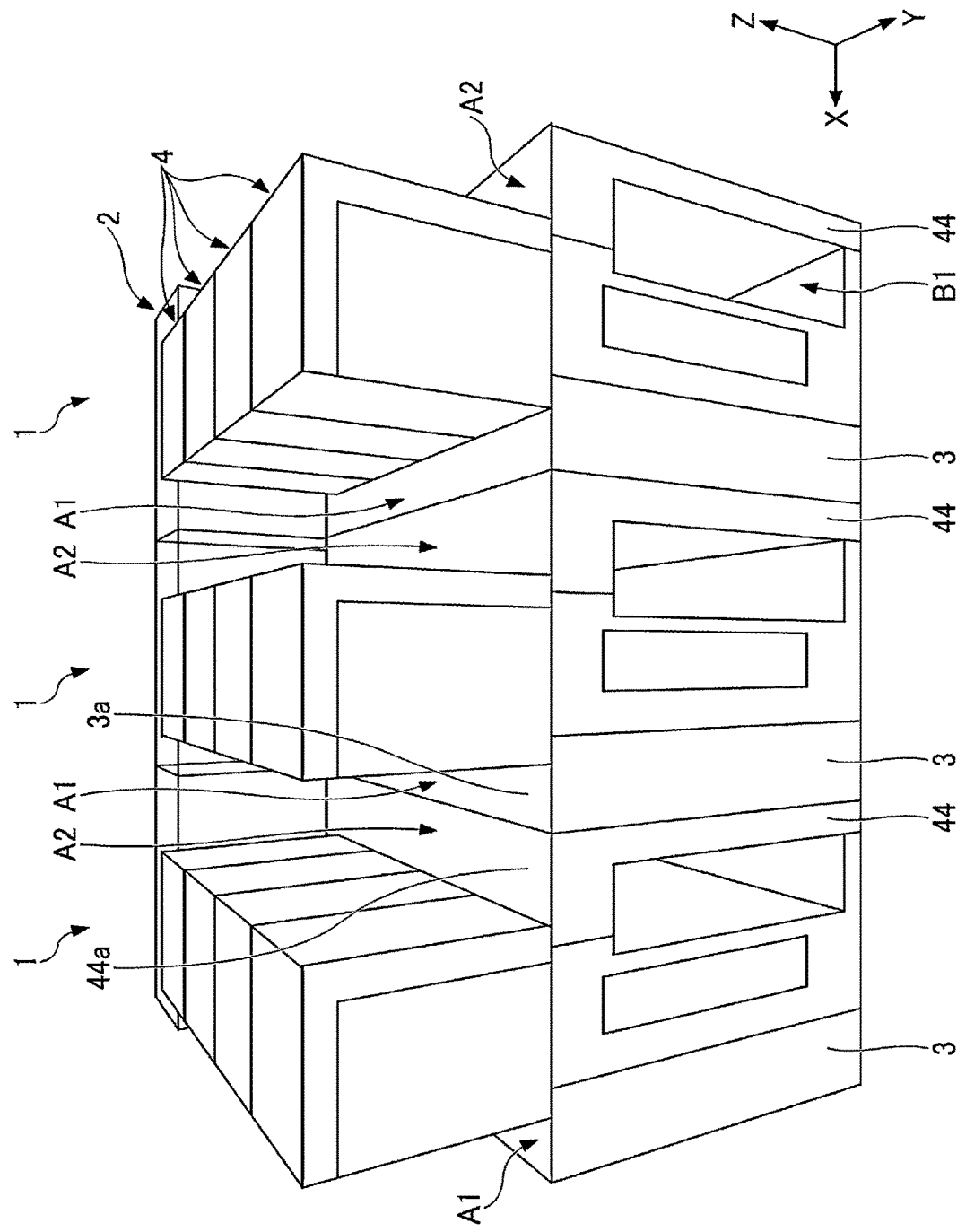
FIG. 18 is a perspective view illustrating an arrangement in which a plurality of substrate processing apparatuses are arranged adjacent to one another.

FIG. 18 is a perspective view illustrating a configuration in which a plurality of substrate processing apparatuses 1 are arranged adjacent to one another along the X-axis direction. In FIG. 18, the X-axis direction, the Y-axis direction, and the Z-axis direction are illustrated with reference to the lower right end of the paper surface. As illustrated in FIG. 18, in the case where the plurality of substrate processing apparatuses 1 are arranged adjacent to one another along the X-axis direction, the width of the upper maintenance area can be secured by sharing the first upper maintenance area A1 and the second upper maintenance area A2 between two adjacent substrate processing apparatuses 1. The width of the shared upper maintenance area may be a length that can be passed by the heater 412. In the case where the heater 412 has the cylindrical shape, for example, the width of the shared upper maintenance area is greater than the diameter of the heater 412. In this case, the operation to replace the heater 412 can easily be performed. The width of the shared upper maintenance area is 1000 mm, for example, and the diameter of the heater 412 is 800 mm, for example. In the shared upper maintenance area, it is possible to perform the operation to replace the heater 412 of one substrate processing apparatus 1 of the two adjacent substrate processing apparatuses 1, and the maintenance of the gas supply unit 43 with respect to the other substrate processing apparatus 1 of the two adjacent substrate processing apparatuses 1.

In addition, the height of the upper surface 44a of the exhaust unit 44 is preferably the same as the height of the upper surface 3a of the substrate transport unit 3. In this case, as illustrated in FIG. 18, there is no step between the upper surface 44a of the exhaust unit 44 and the upper surface 3a of the substrate transport unit 3 between the two adjacent substrate processing apparatuses 1. For this reason, it is possible to improve a work efficiency when the operator attends to the maintenance of each part of the batch processing unit 4 in the first upper maintenance area A1 and the second upper maintenance area A2. In a case where the height of the upper surface 44a of the exhaust unit 44 and the height of the upper surface 3a of the substrate transport unit 3 are different, it is preferable to place a plate-shaped member on the upper surface of the lower one of the exhaust unit 44 and the substrate transport unit 3, so as to align the upper surfaces of the exhaust unit 44 and the substrate transport unit 3 to the same height. In addition, in the case where the plurality of substrate processing apparatuses 1 are arranged side by side along the X-axis direction, a gap may be provided between the substrate transport unit 3 and the exhaust unit 44, so as to install the exhaust system.

Figure 19:
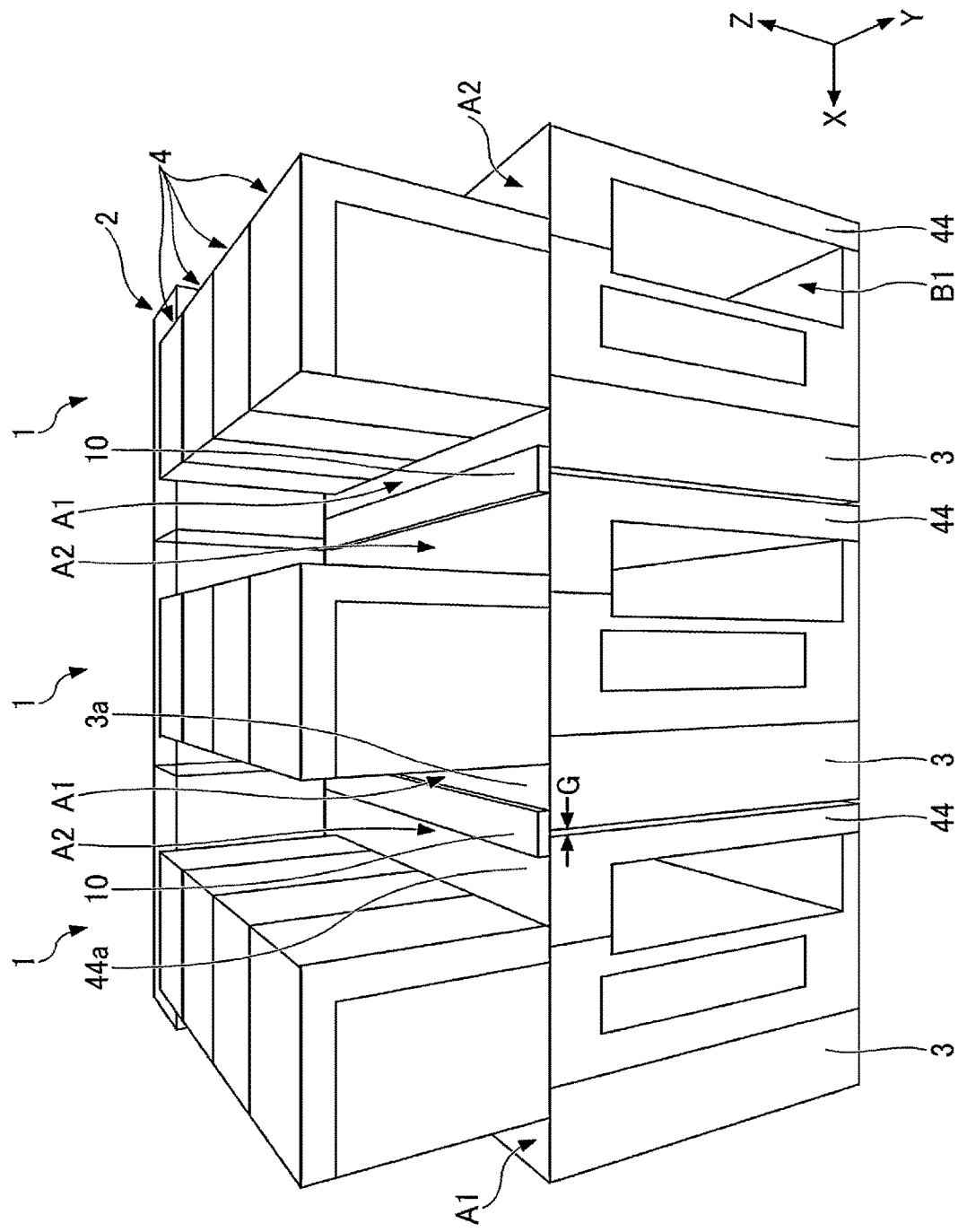
FIG. 19 is a perspective view illustrating a first modification of the arrangement in which the plurality of substrate processing apparatuses are arranged adjacent to one another.
Figure 20:
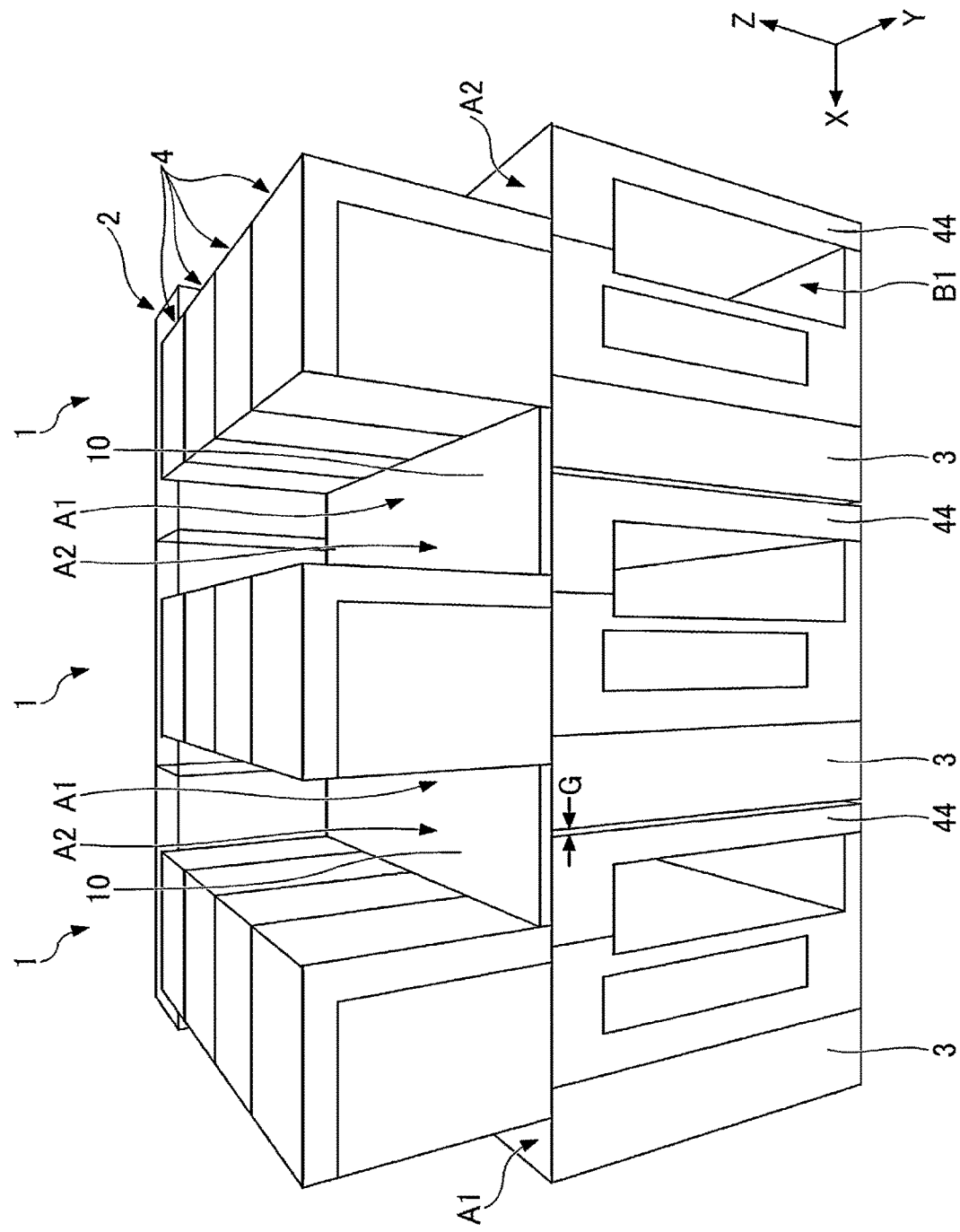
FIG. 20 is a perspective view illustrating a second modification of the arrangement in which the plurality of substrate processing apparatuses are arranged adjacent to one another.
Figure 21:
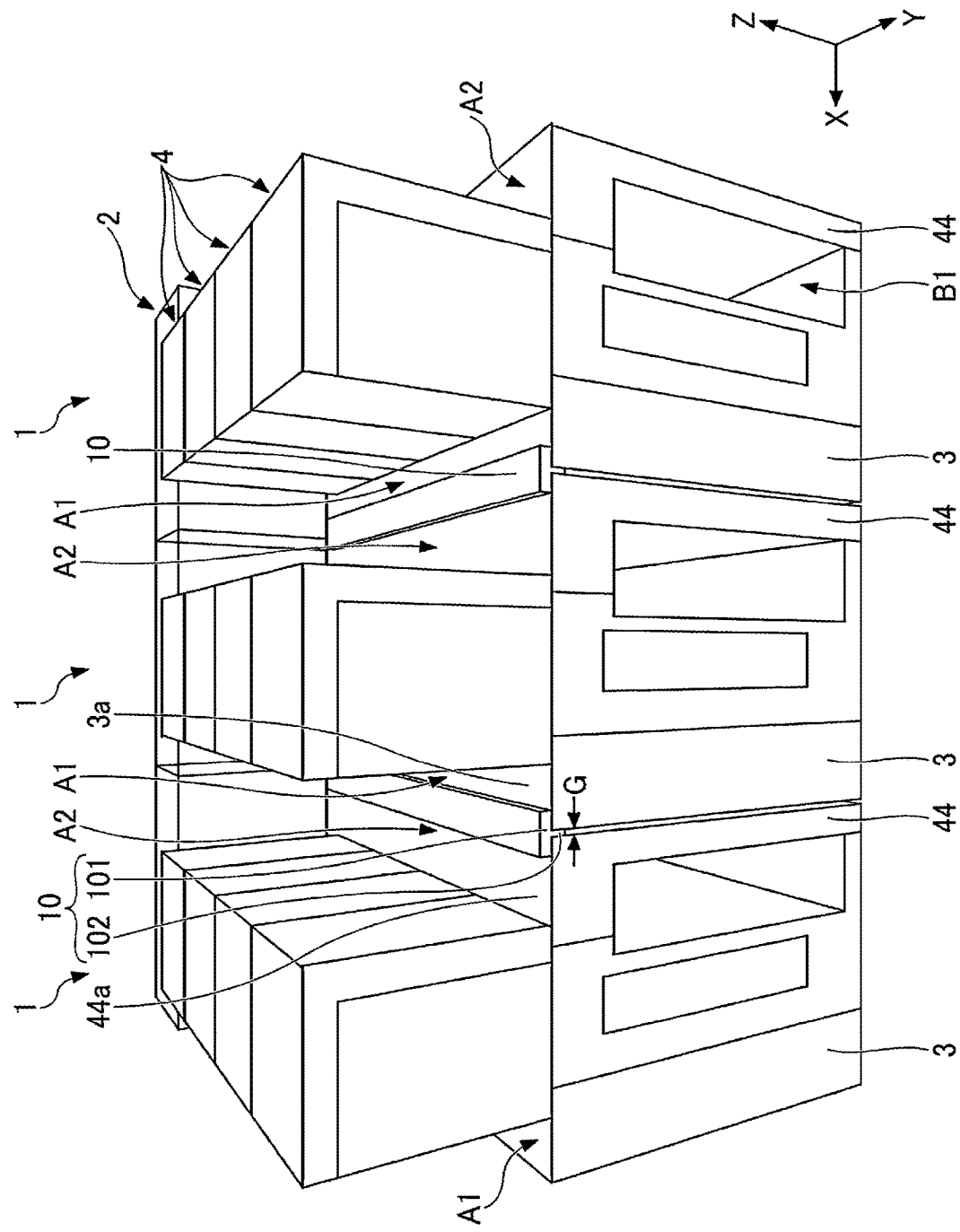
FIG. 21 is a perspective view illustrating a third modification of the arrangement in which the plurality of substrate processing apparatuses are arranged adjacent to one another.

FIG. 19 is a perspective view illustrating a first modification in which the plurality of substrate processing apparatuses 1 are arranged adjacent to one another. FIG. 20 is a perspective view illustrating a second modification in which the plurality of substrate processing apparatuses 1 are arranged adjacent to one another. FIG. 21 is a perspective view illustrating a third modification in which the plurality of substrate processing apparatuses 1 are arranged adjacent to one another. In FIG. 19 through FIG. 21, the X-axis direction, the Y-axis direction, and the Z-axis direction are illustrated with reference to the lower right end of the paper surface.

As illustrated in FIG. 19 through FIG. 21, in the case where the plurality of substrate processing apparatuses 1 are arranged adjacent to one another along the X-axis direction, a gap G may be formed between the upper surface 44a of the exhaust unit 44 and the upper surface 3a of the substrate transport unit 3, between the two adjacent substrate processing apparatuses 1. The gap G is in a range greater than or equal to 30 mm and less than or equal to 50 mm, for example, and is small. In the first through third modifications, a plate-shaped member 10 extending along the Y-axis direction is provided on the upper surface 44a of the exhaust unit 44 and the upper surface 3a of the substrate transport unit 3, between the two adjacent substrate processing apparatuses 1 so as to fill the gap G. In this case, it is possible to prevent a component or the like from falling during the maintenance. A length of the plate-shaped member 10 along the Y-axis direction may be the same as the length of the upper surface 44a of the exhaust unit 44 along the Y-axis direction, for example. The length of the plate-shaped member 10 along the Y-axis direction may be the same as the length of the upper surface 3a of the substrate transport unit 3 along the Y-axis direction, for example.

As illustrated in FIG. 19, the plate-shaped member 10 may have a flat shape covering a portion of the upper surface 44a of the exhaust unit 44 and a portion of the upper surface 3a of the substrate transport unit 3. The length of the plate-shaped member 10 along the X-axis direction may be shorter than a sum of the length of the upper surface 44a of the exhaust unit 44 along the X-axis direction and the length of the upper surface 3a of the substrate transport unit 3 along the X-axis direction.

As illustrated in FIG. 20, the plate-shaped member 10 may have a flat shape covering the entire upper surface 44a of the exhaust unit 44 and the entire upper surface 3a of the substrate transport unit 3. In this case, a step caused by a thickness of the plate-shaped member 10 will not occur. For this reason, in the shared upper maintenance area, it is possible to prevent the operator from tripping due to the step.

As illustrated in FIG. 21, the plate-shaped member 10 has a T-shape when viewed in the Y-axis direction. The plate-shaped member 10 includes a horizontal portion 101, and a vertical portion 102. The horizontal portion 101 has a flat shape extending along the Y-axis direction so as to fill the gap G. The horizontal portion 101 covers at least a portion of the upper surface 44a of the exhaust unit 44 and at least a portion of the upper surface 3a of the substrate transport unit 3. The vertical portion 102 has a flat shape extending from a lower surface of the horizontal portion 101 toward the negative side along the Z-axis direction. The vertical portion 102 extends along the Y-axis direction and fits into the gap G. In this case, it is possible to prevent a positional error of the plate-shaped member 10 along the X-axis direction. A length of the vertical portion 102 along the X-axis direction may be the same as a width of the gap G, or may be shorter than the width of the gap G.

According to the present disclosure, it is possible to reduce an installation area of a substrate processing apparatus including a plurality of batch processing units, and to facilitate maintenance of the plurality of batch processing units.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a loading and unloading unit having a first side surface through which a container accommodating a substrate is loaded and unloaded, and a second side surface opposite to the first side surface;
a substrate transport unit extending along a longitudinal direction thereof in a first horizontal direction perpendicular to the second side surface; and
a plurality of batch processing units arranged adjacent to one another along the longitudinal direction of the substrate transport unit, wherein:
each batch processing unit of the plurality of batch processing units includes:
 a processing container, having a first side located adjacent to the substrate transport unit and a second side opposite to the first side, and configured to accommodate and process a plurality of substrates,
 a gas supply unit located adjacent to the second side of the processing container and configured to supply a gas into the processing container, and an exhaust unit located adjacent to the second side of the processing container and configured to exhaust the gas inside the processing container, and a first maintenance area, used for attending to a maintenance of the plurality of batch processing units, is provided above the exhaust unit.

2. The substrate processing apparatus as claimed in claim 1, wherein a second maintenance area, used for attending to the maintenance of the plurality of batch processing units, is provided above the substrate transport unit.

3. The substrate processing apparatus as claimed in claim 2, wherein an upper surface of the exhaust unit and an upper surface of the substrate transport unit are located at identical height positions, the substrate processing apparatus is disposed adjacent to an other substrate processing apparatus along a second horizontal direction perpendicular to the first horizontal direction, the other substrate processing apparatus and the substrate processing apparatus have identical configurations, and a shared maintenance area is formed by the first maintenance area of the substrate processing apparatus and the second maintenance area of the other substrate processing apparatus, or is formed by the second maintenance area of the substrate processing apparatus and the first maintenance area of the other substrate processing apparatus.

4. The substrate processing apparatus as claimed in claim 1, further comprising:

a fence, attached to the exhaust unit, and extending above an upper surface of the exhaust unit.

5. The substrate processing apparatus as claimed in claim 2, further comprising:

a scaffold attached to the substrate transport unit, wherein the second maintenance area is provided above the substrate transport unit and the scaffold.

6. The substrate processing apparatus as claimed in claim 5, wherein the scaffold includes a support member, a floor plate supported by the support member, and a fence, attached to the support member, and located at a position above the floor plate.

7. The substrate processing apparatus as claimed in claim 3, wherein each batch processing unit of the plurality of batch processing units includes a heater provided around the processing container, and a length of the shared maintenance area along the second horizontal direction is a length that can be passed by the heater.

8. The substrate processing apparatus as claimed in claim 6, wherein each batch processing unit of the plurality of batch processing units includes a heater provided around the processing container, and a sum of a length of an upper surface of the substrate transport unit along a second horizontal direction perpendicular to the first horizontal direction, and a length of the floor plate along the second horizontal direction, is a length that can be passed by the heater.

9. The substrate processing apparatus as claimed in claim 1, wherein the exhaust unit is located at a height position below the gas supply unit.

10. The substrate processing apparatus as claimed in claim 1, wherein the substrate transport unit includes a transport device configured to transport the substrate between the loading and unloading unit and each batch processing unit of the plurality of batch processing units.

11. The substrate processing apparatus as claimed in claim 10, wherein the transport device is configured to simultaneously transport a plurality of substrates between the loading and unloading unit and each batch processing unit of the plurality of batch processing units.

* * * * *